US012796085B2

(12) United States Patent
Yao et al.

(10) Patent No.: US 12,796,085 B2
(45) Date of Patent: Nov. 10, 2026

(54) WIRING BOARD AND METHOD FOR MANUFACTURING THE SAME, FUNCTIONAL BACKPLANE, BACKLIGHT MODULE, DISPLAY MODULE AND DISPLAY APPARATUS

(71) Applicant: BOE TECHNOLOGY GROUP CO., LTD., Beijing (CN)

(72) Inventors: Nianqi Yao, Beijing (CN); Yingwei Liu, Beijing (CN); Guangcai Yuan, Beijing (CN); Ce Ning, Beijing (CN); Zhengliang Li, Beijing (CN); Zhanfeng Cao, Beijing (CN); Ke Wang, Beijing (CN); Kun Zhao, Beijing (CN); Qi Qi, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 351 days.

(21) Appl. No.: 18/710,464

(22) PCT Filed: Aug. 23, 2022

(86) PCT No.: PCT/CN2022/114350

§ 371 (c)(1),
(2) Date: May 15, 2024

(87) PCT Pub. No.: WO2024/040448

PCT Pub. Date: Feb. 29, 2024

(65) Prior Publication Data

US 2026/0173528 A1 Jun. 18, 2026

(51) Int. Cl.
*H10K 59/82* (2023.01)
*H10D 86/40* (2025.01)
(Continued)

(52) U.S. Cl.
CPC .......... *H10D 86/441* (2025.01); *H10D 86/60* (2025.01); *H10H 29/49* (2025.01);
(Continued)

(58) Field of Classification Search
CPC .... H10D 86/441; H10D 86/021; H10D 86/60; H10D 84/01; H10H 29/49; H10H 29/142;
(Continued)

(56) References Cited

U.S. PATENT DOCUMENTS

| | | | |
|---|---|---|---|
| 6,519,845 | B1 | 2/2003 | Cutting et al. |
| 2002/0076911 | A1 | 6/2002 | Lin |

(Continued)

FOREIGN PATENT DOCUMENTS

| | | | |
|---|---|---|---|
| CN | 101452988 | A | 6/2009 |
| CN | 101471318 | A | 7/2009 |

(Continued)

OTHER PUBLICATIONS

Jindu, Lin, "A brief summary of the surface coating (plating) layers of PCB soldering pads", Special Plating PCB Coating, 2016, No. 8.

(Continued)

*Primary Examiner* — Eduardo A Rodela
(74) *Attorney, Agent, or Firm* — The Webb Law Firm

(57) ABSTRACT

A wiring board includes a base substrate, an active pattern layer, and an electrical pattern layer. The active pattern layer is arranged on a side of the base substrate and includes a plurality of active patterns. The electrical pattern layer is arranged on a side of the active pattern layer away from the base substrate, and includes a plurality of connection portions, and at least one connection portion is coupled to an active pattern. A connection portion includes a plurality of first sub-layers which are stacked arranged in a thickness direction of the base substrate, two first sub-layers are farthest away from the base substrate among the plurality of (Continued)

first sub-layers are a first conductive sub-layer and a first protective sub-layer. The first protective sub-layer is arranged on a side of the first conductive sub-layer away from the base substrate, and the material of the first protective sub-layer includes nickel.

20 Claims, 20 Drawing Sheets

(51) Int. Cl.

| | |
|---|---|
| ***H10D 86/60*** | (2025.01) |
| ***H10H 29/49*** | (2025.01) |
| ***H10H 29/80*** | (2025.01) |
| ***H10K 59/131*** | (2023.01) |
| ***H10K 59/80*** | (2023.01) |

(52) U.S. Cl.
CPC ..... *H10H 29/8322* (2025.01); *H10K 59/1315* (2023.02); *H10K 59/80517* (2023.02); *H10K 59/82* (2023.02)

(58) Field of Classification Search
CPC .. H10H 29/30; H10H 29/8322; H10H 29/032; H10H 29/0364; H10H 29/832; H10H 29/857; G02F 1/133612; H10K 59/131; H10K 59/1315; H10K 59/805; H10K 59/80517; H10K 59/80523; H10K 59/82
See application file for complete search history.

(56) References Cited

U.S. PATENT DOCUMENTS

| | | | |
|---|---|---|---|
| 2003/0127701 | A1 | 7/2003 | Tiziani et al. |
| 2004/0166702 | A1 | 8/2004 | Higashi |
| 2007/0120233 | A1 | 5/2007 | Tellkamp |
| 2007/0232051 | A1 | 10/2007 | Wang et al. |
| 2008/0081157 | A1 | 4/2008 | Schneegans et al. |
| 2009/0297879 | A1 | 12/2009 | Zeng et al. |
| 2010/0213608 | A1 | 8/2010 | Lau et al. |
| 2011/0006415 | A1 | 1/2011 | Bachman et al. |
| 2013/0000978 | A1 | 1/2013 | Choi et al. |
| 2013/0107155 | A1 | 5/2013 | Guo et al. |
| 2013/0241058 | A1 | 9/2013 | Yu et al. |
| 2014/0353634 | A1 | 12/2014 | Lee et al. |
| 2015/0099316 | A1 | 4/2015 | Ryu et al. |
| 2017/0250171 | A1 | 8/2017 | Yu et al. |
| 2019/0229446 | A1 | 7/2019 | Kim et al. |
| 2021/0143134 | A1 | 5/2021 | Wang |
| 2021/0242146 | A1 | 8/2021 | Arvin et al. |
| 2021/0358896 | A1 | 11/2021 | Lee et al. |
| 2021/0359182 | A1 | 11/2021 | Cao et al. |
| 2022/0181245 | A1 | 6/2022 | Ko et al. |
| 2024/0215380 | A1* | 6/2024 | Shin ..................... H10K 59/122 |
| 2024/0234658 | A1 | 7/2024 | He et al. |
| 2024/0260185 | A1 | 8/2024 | Zhang et al. |
| 2024/0423025 | A1* | 12/2024 | Hodo ..................... H10K 59/10 |

FOREIGN PATENT DOCUMENTS

| | | | |
|---|---|---|---|
| CN | 101507373 | A | 8/2009 |
| CN | 102024769 | A | 4/2011 |
| CN | 202095173 | U | 12/2011 |
| CN | 202159705 | U | 3/2012 |
| CN | 102437135 | A | 5/2012 |
| CN | 104201121 | A | 12/2014 |
| CN | 104244566 | A | 12/2014 |
| CN | 104561943 | A | 4/2015 |
| CN | 104600090 | A | 5/2015 |
| CN | 105304646 | A | 2/2016 |
| CN | 206471352 | U | 9/2017 |
| CN | 108122955 | A | 6/2018 |
| CN | 111312742 | A | 6/2020 |
| CN | 211128026 | U | 7/2020 |
| CN | 111862886 | A | 10/2020 |
| CN | 113066834 | A | 7/2021 |
| CN | 113964112 | A | 1/2022 |
| CN | 114171661 | A | 3/2022 |
| CN | 114203932 | A | 3/2022 |
| CN | 114447053 | A | 5/2022 |
| CN | 114843390 | A | 8/2022 |
| EP | 2276063 | A2 | 1/2011 |
| JP | H08125310 | A | 5/1996 |
| JP | 2006179797 | A | 7/2006 |
| JP | 2009065116 | A | 3/2009 |
| JP | 2009147123 | A | 7/2009 |
| JP | 2016146377 | A | 8/2016 |
| KR | 1020210133777 | A | 11/2021 |
| TW | 201417649 | A | 5/2014 |
| WO | 2008092708 | A1 | 8/2008 |
| WO | 2020153770 | A1 | 7/2020 |

OTHER PUBLICATIONS

EP 22955997.6, Extended European Search Report, Mar. 12, 2025.
PCT/CN2021/142667,International Search Report, Aug. 12, 2022.

* cited by examiner

WIRING BOARD AND METHOD FOR MANUFACTURING THE SAME, FUNCTIONAL BACKPLANE, BACKLIGHT MODULE, DISPLAY MODULE AND DISPLAY APPARATUS

CROSS-REFERENCE TO RELATED APPLICATION

This application is the United States national phase of International Patent Application No. PCT/CN 2022/114350, filed Aug. 23, 2022, the disclosure of which is hereby incorporated by reference in its entirety.

BACKGROUND OF THE INVENTION

Field of the Invention

The present disclosure relates to the field of display technologies, and in particular, to a wiring board and a method for manufacturing the same, a functional backplane, a backlight module, a display module and display apparatus.

Description of Related Art

A mini light-emitting diode (mini LED) refers to a light-emitting diode with a size from 80 μm to 200 μm. In a case where mini LEDs serve as pixel points of a display panel to constitute a self-luminous display, the self-luminous display may achieve a rather high pixel density compared to a small-pitch LED display. In a case where mini LEDs serve as light sources to be applied to a backlight module, an ultra-thin light source module may be produced through a rather dense light source arrangement, and in cooperation with local dimming technology, a display apparatus (e.g., a mobile phone) including the mini LED backlight module may have a rather good contrast and a rather good high dynamic lighting rendering display effect. A micro light-emitting diode (micro LED) is a light-emitting diode with a size less than 80 μm, and may be directly used as a pixel point of a display panel in a display apparatus.

SUMMARY OF THE INVENTION

In an aspect, a wiring board is provided. The wiring board includes a base substrate, an active pattern layer and an electrical pattern layer. The active pattern layer is disposed on a side of the base substrate and includes a plurality of active patterns. The electrical pattern layer is disposed on a side of the active pattern layer away from the base substrate and includes a plurality of connection portions, and at least one connection portion is coupled to an active pattern. A connection portion includes a plurality of first sub-layers that are stacked in a thickness direction of the base substrate, and two first sub-layers farthest away from the base substrate in the plurality of first sub-layers are a first conductive sub-layer and a first protective sub-layer. The first protective sub-layer is disposed on a side of the first conductive sub-layer away from the base substrate, and a material of the first protective sub-layer includes nickel.

Optionally, the material of the first protective sub-layer is pure nickel. Alternatively, the material of the first protective sub-layer is nickel alloy with an atomic percentage of nickel greater than or equal to 40%.

Optionally, the material of the first protective sub-layer further includes at least one of tungsten, vanadium, palladium, aluminum, titanium, zirconium, molybdenum, copper, yttrium, niobium, platinum, tin, tantalum, gold and silver.

Optionally, a thickness of the first protective sub-layer is in a range of 80 Å to 5000 Å, inclusive.

Optionally, the plurality of first sub-layers further include at least one second protective sub-layer disposed on a side of the first conductive sub-layer proximate to the base substrate, and a material of the second protective sub-layer includes nickel.

Optionally, the plurality of first sub-layers further include at least one second conductive sub-layer disposed on the side of the first conductive sub-layer proximate to the base substrate. The second conductive sub-layer and the second protective sub-layer are disposed alternately, and a second protective sub-layer is in contact with the first conductive sub-layer.

Optionally, the material of the second protective sub-layer and the material of the first protective sub-layer include a same composition.

Optionally, an atomic percentage of nickel in the material of the second protective sub-layer is less than or equal to an atomic percentage of nickel in the material of the first protective sub-layer.

Optionally, the plurality of first sub-layers further include a first buffer sub-layer, and the first buffer sub-layer is a first sub-layer closest to the base substrate in the plurality of first sub-layers. A material of the first buffer sub-layer contains different components from both the material of the first protective sub-layer and a material of the first conductive sub-layer.

Optionally, the material of the first buffer sub-layer includes at least one of molybdenum-niobium alloy, molybdenum-nickel-titanium alloy, molybdenum, molybdenum alloy, titanium and titanium-copper alloy.

Optionally, a ratio of areas of orthographic projections of any two first sub-layers in the plurality of first sub-layers on the base substrate is in a range of 0.9 to 1.1, inclusive.

Optionally, the connection portion includes a bottom surface and a side surface; the bottom surface is a surface of the connection portion closest to and parallel to the base substrate, and the side surface is adjacent to the bottom surface. An included angle between the side surface and the bottom surface is in a range of 40° to 90°, inclusive.

Optionally, the wiring board further includes a transfer portion disposed between the electrical pattern layer and the active pattern layer, and the transfer portion is coupled to the active pattern and a connection portion in the at least one connection portion.

Optionally, the transfer portion includes at least one of a first protection sub-layer and a second protection sub-layer, and a transfer sub-layer. The first protection sub-layer is stacked on a side of the transfer sub-layer away from the base substrate, and a material of the first protection sub-layer includes nickel. The second protection sub-layer is stacked on a side of the transfer sub-layer proximate to the base substrate, and a material of the second protection sub-layer includes nickel.

Optionally, the wiring board further includes a gate pattern layer. The gate pattern layer is disposed on the base substrate and includes a plurality of gates. A gate includes at least one of a third protection sub-layer and a fourth protection sub-layer, and a gate conductive sub-layer. The third protection sub-layer is stacked on a side of the gate conductive sub-layer away from the base substrate, and a material of the third protection sub-layer includes nickel. The fourth protection sub-layer is stacked on a side of the gate conductive sub-layer proximate to the base substrate, and a material of the fourth protection sub-layer includes nickel.

Optionally, the wiring board further includes a gate pattern layer disposed between the active pattern layer and the base substrate and including a plurality of gates. An orthographic projection of a gate on the base substrate covers an orthographic projection of the active pattern on the base substrate. The electrical pattern layer further includes a light-shielding portion, and an orthographic projection of the light-shielding portion on the base substrate covers the orthographic projection of the active pattern on the base substrate. The light-shielding portion includes a plurality of second sub-layers that are stacked. In the direction perpendicular to the base substrate, a second sub-layer and a first sub-layer with a same stacking order have a same material.

In another aspect, a functional backplane is provided. The functional backplane includes the above wiring board, an electronic component and a first intermetallic compound. The wiring board has a device region and a bonding region. The electronic component is disposed on a side of the electrical pattern layer away from the base substrate. A portion of a connection portion in the electrical pattern layer located in the device region is coupled to the electronic component by the first intermetallic compound.

Optionally, the electronic component includes a light-emitting device, a driver component or a sensing device.

Optionally, the functional backplane further includes a circuit board and a second intermetallic compound. The circuit board is coupled to the wiring board. A portion of a connection portion located in the bonding region is coupled to the circuit board by the second intermetallic compound.

In yet another aspect, a backlight module is provided. The backlight module includes the above functional backplane, and the electronic component is a light-emitting device.

In yet another aspect, a display module is provided. The display module includes the above functional backplane, and the electronic component is a light-emitting device.

In yet another aspect, a display apparatus is provided. The display apparatus includes the above backlight module or the above display module.

In yet another aspect, a method for manufacturing a functional backplane is provided. The method includes following steps.

An active pattern layer is formed on a base substrate. The active pattern layer includes a plurality of active patterns.

An electrical pattern layer is formed on the base substrate on which the active pattern layer has been formed. The electrical pattern layer includes a plurality of connection portions, and at least one connection portion is coupled to an active pattern. A connection portion includes a plurality of first sub-layers that are stacked, and two first sub-layers farthest away from the base substrate in the plurality of first sub-layers are a first conductive sub-layer and a first protective sub-layer. The first protective sub-layer is disposed on a side of the first conductive sub-layer away from the base substrate, and a material of the first protective sub-layer includes nickel.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

Figure 6:
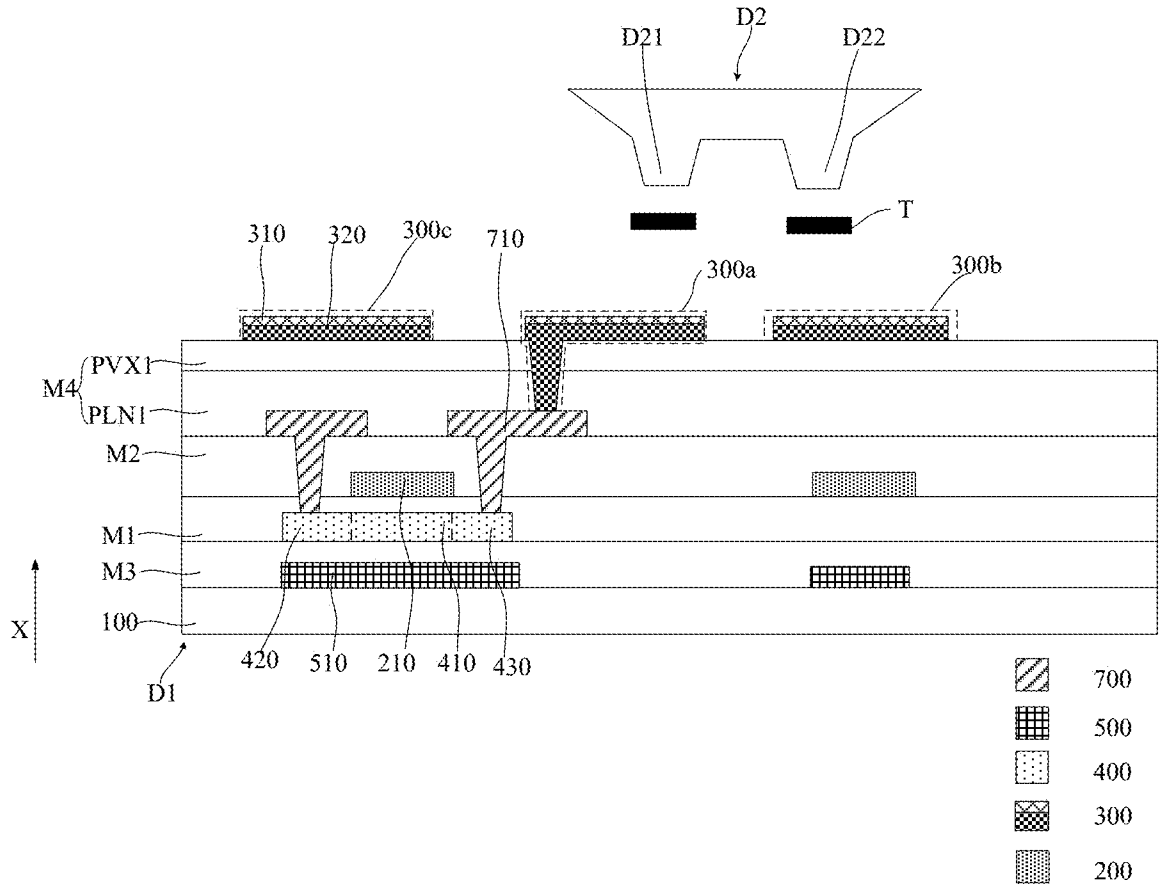
FIG. 6 is a structural diagram of a stacked structure of a wiring board and a relative position of an electronic component on the wiring board, in accordance with some embodiments.
Figure 10:
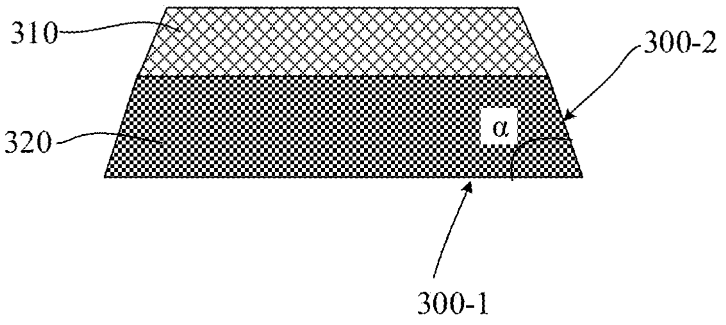
Figure 11:
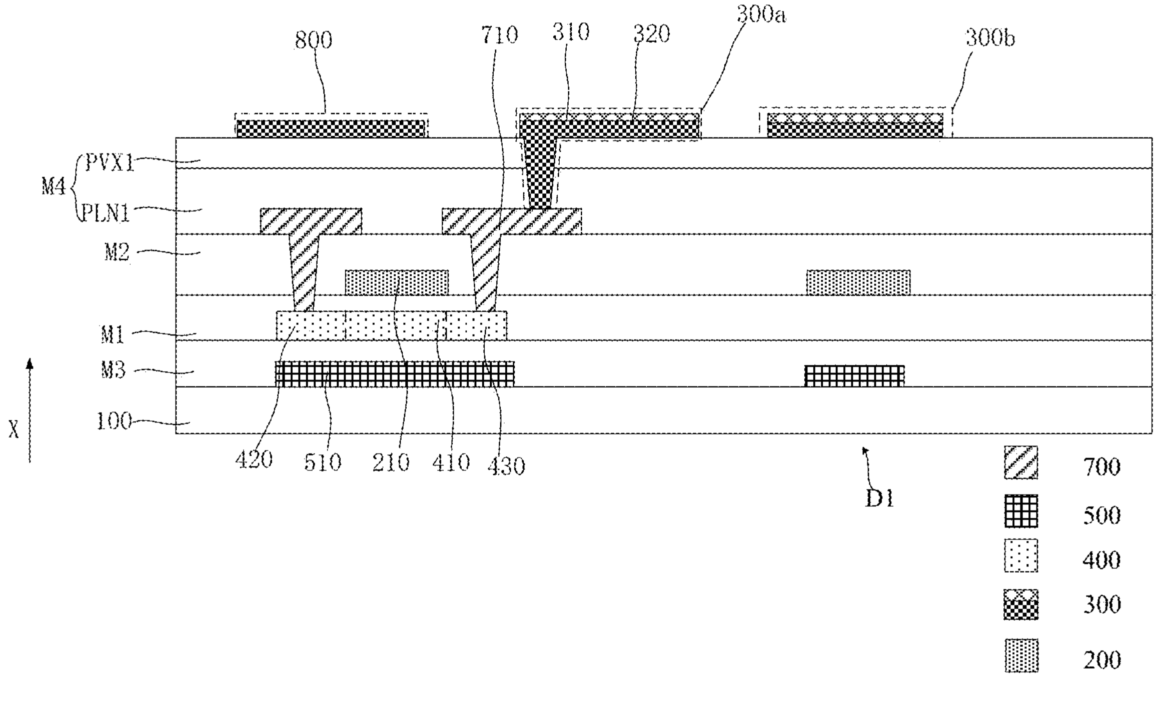
Figure 12:
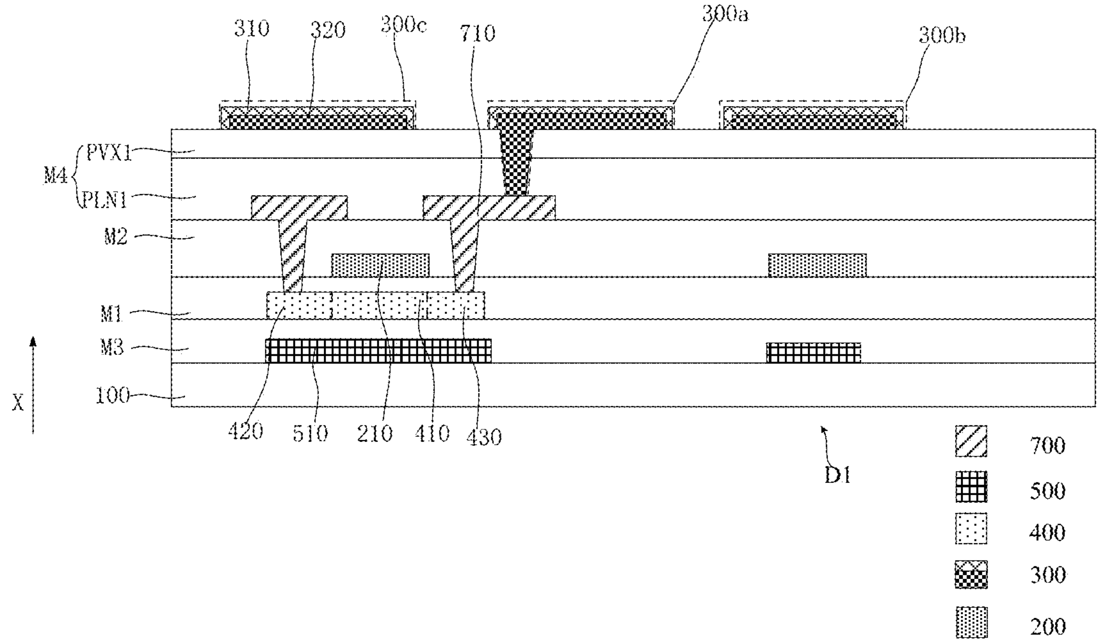
Figure 13:
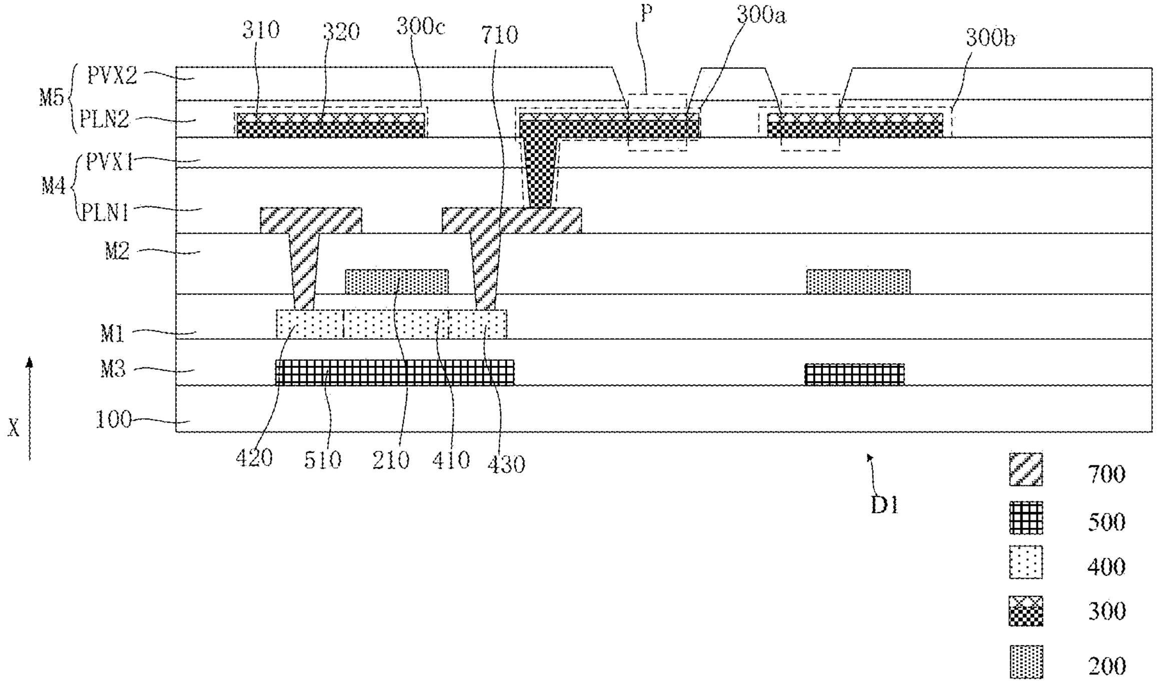
Figure 14:
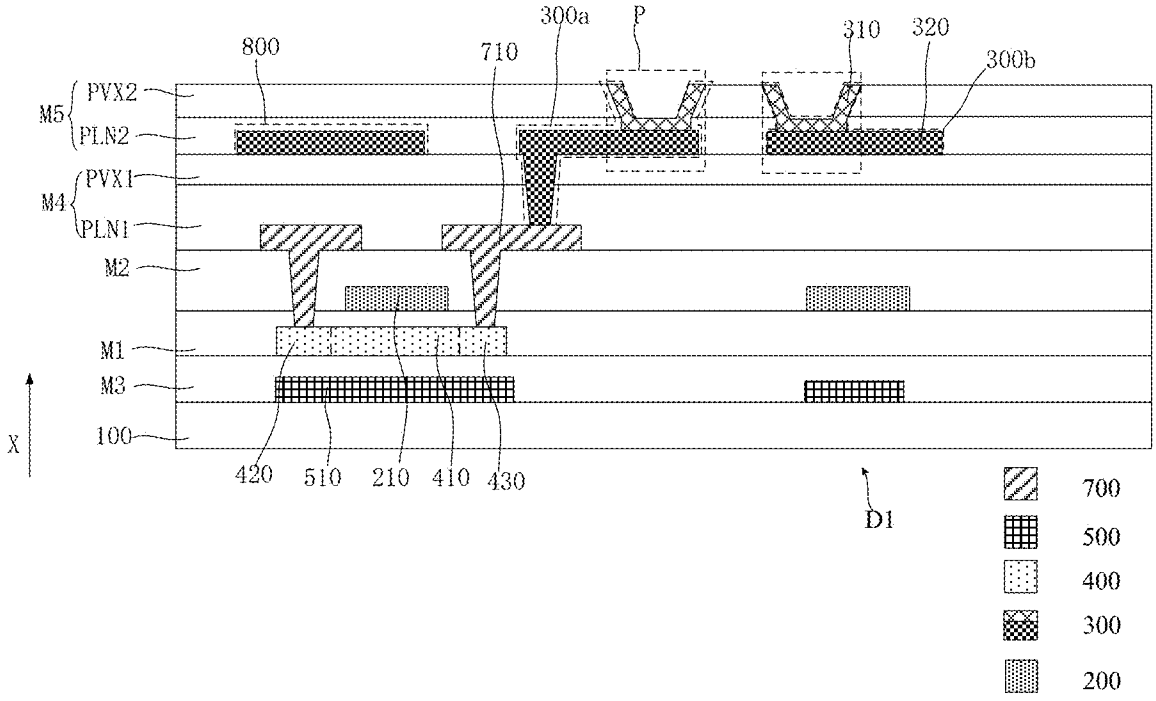
Figure 15:
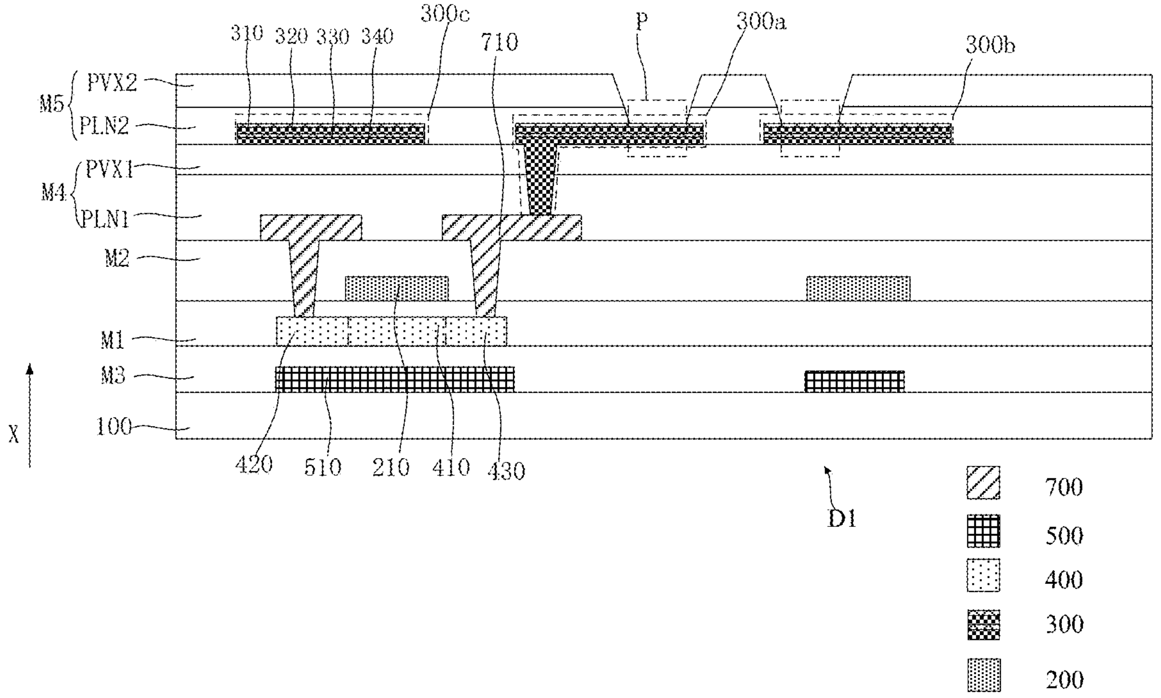
Figure 16:
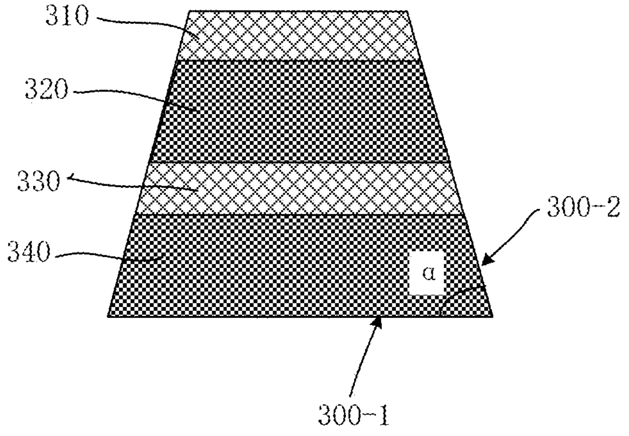
Figure 17:
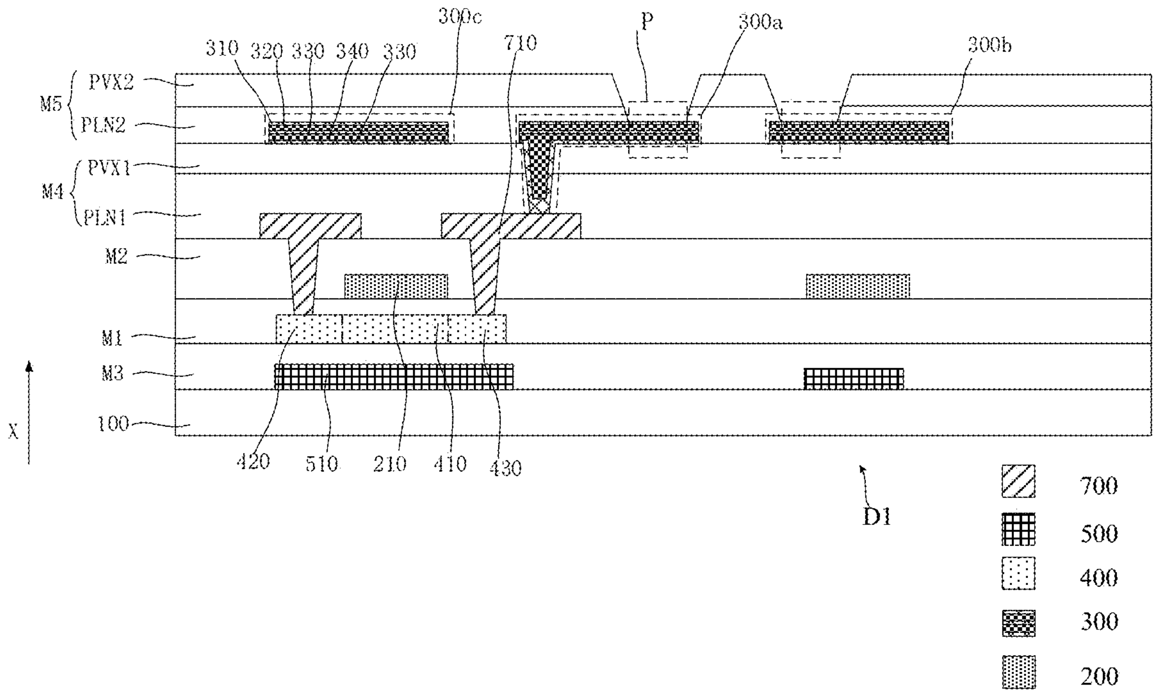
Figure 18:
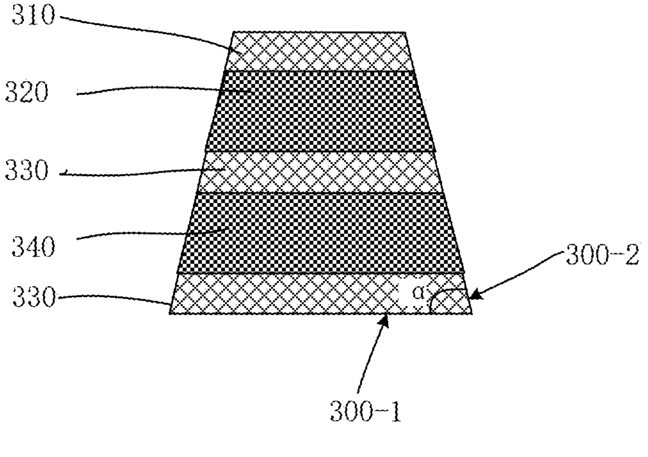
Figure 19:
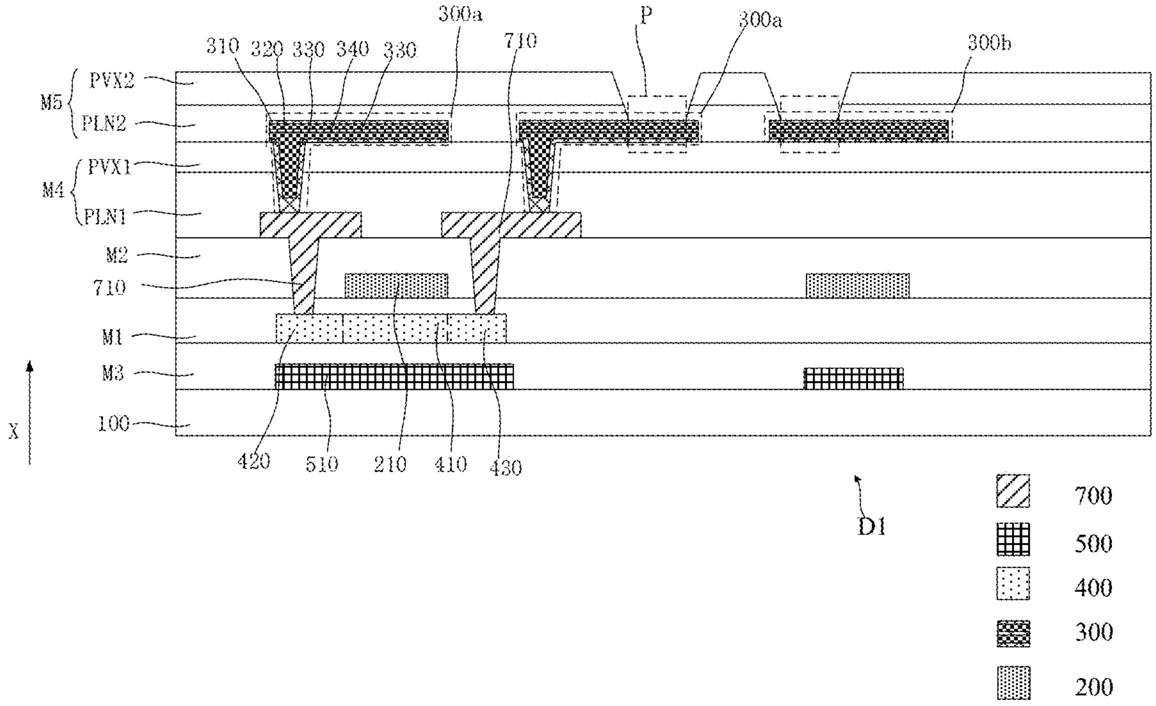
Figure 20:
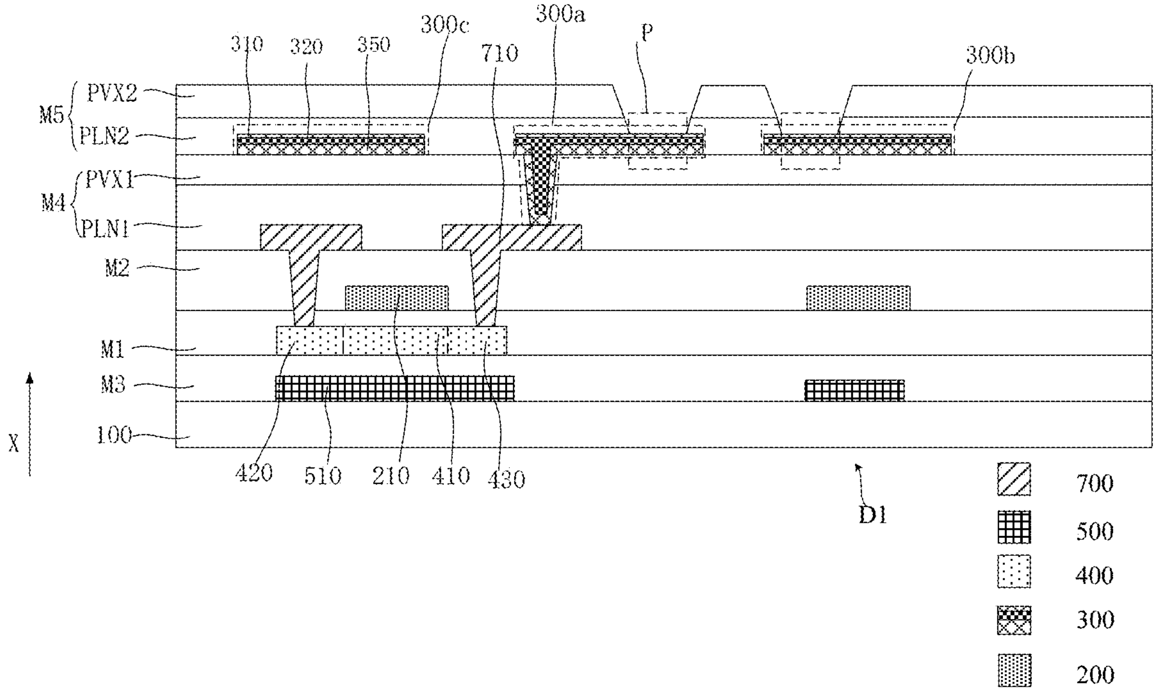
Figure 21:
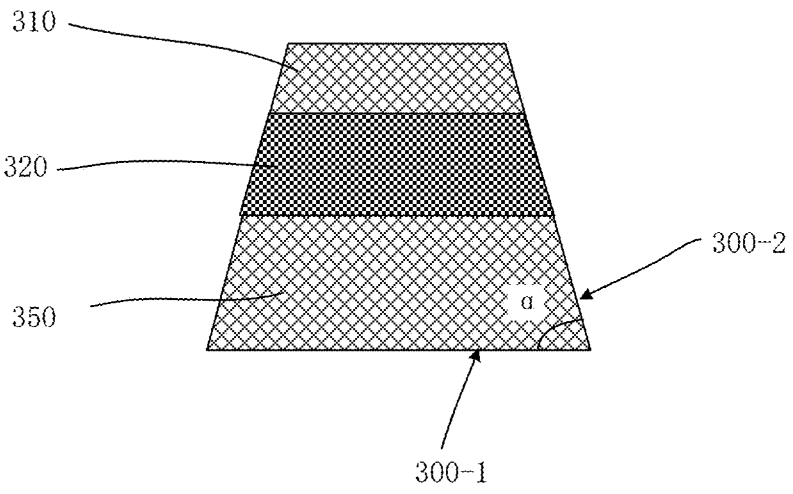
Figure 22:
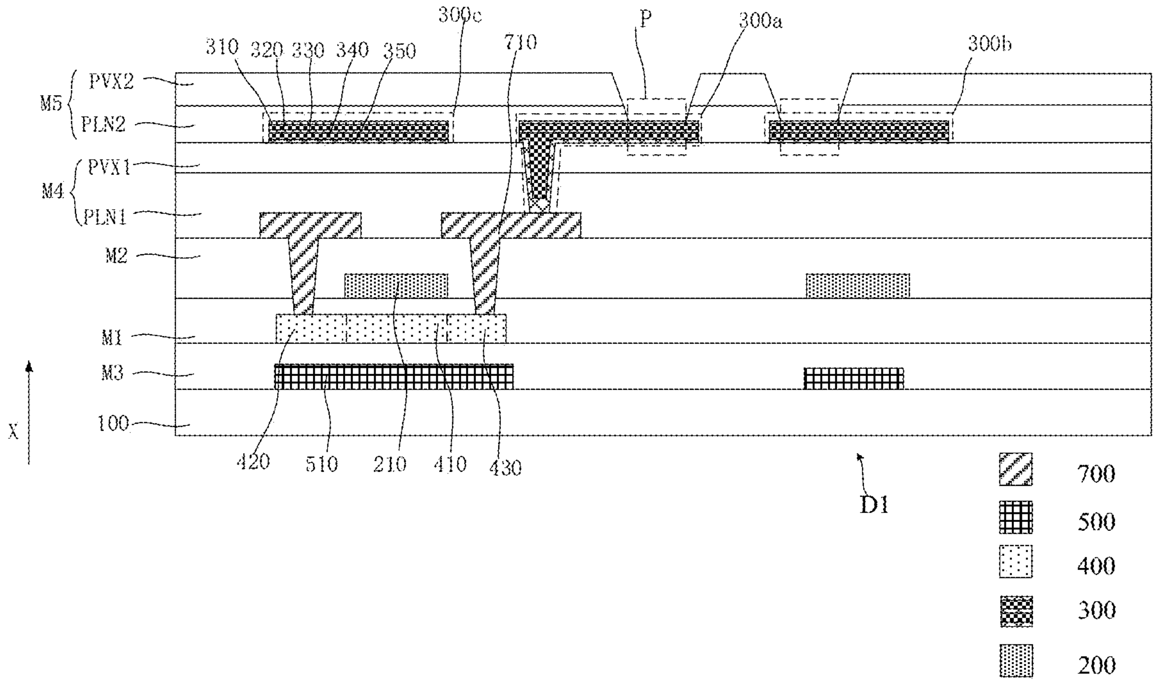
Figure 23:
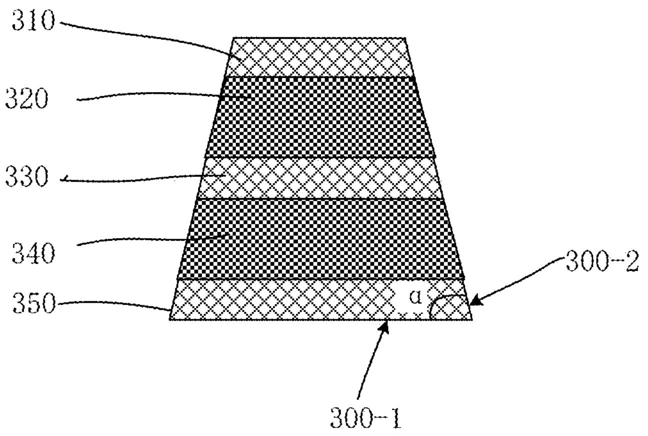
Figure 24:
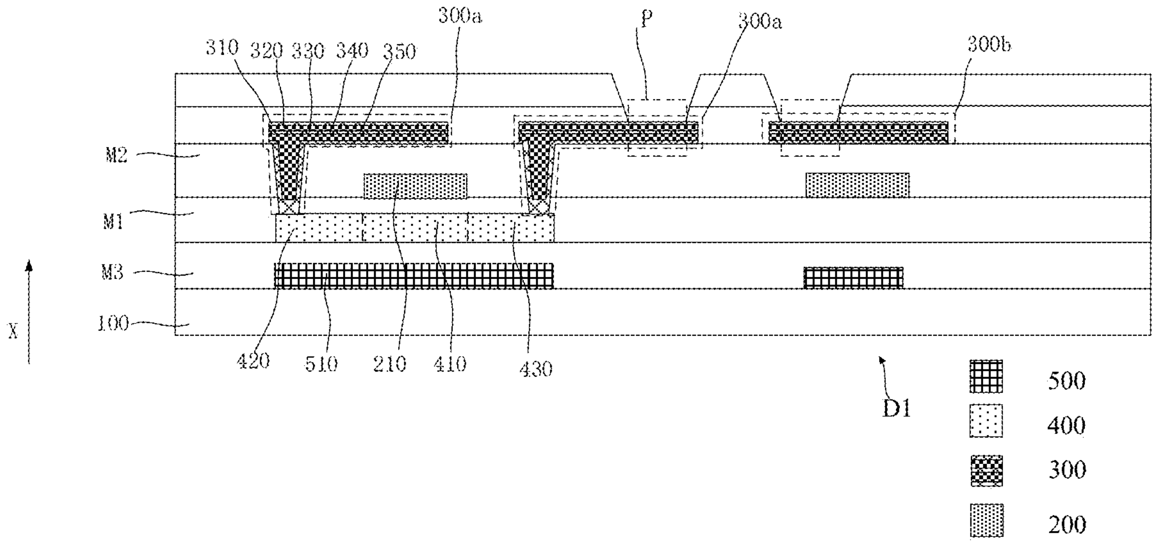
Figure 25:
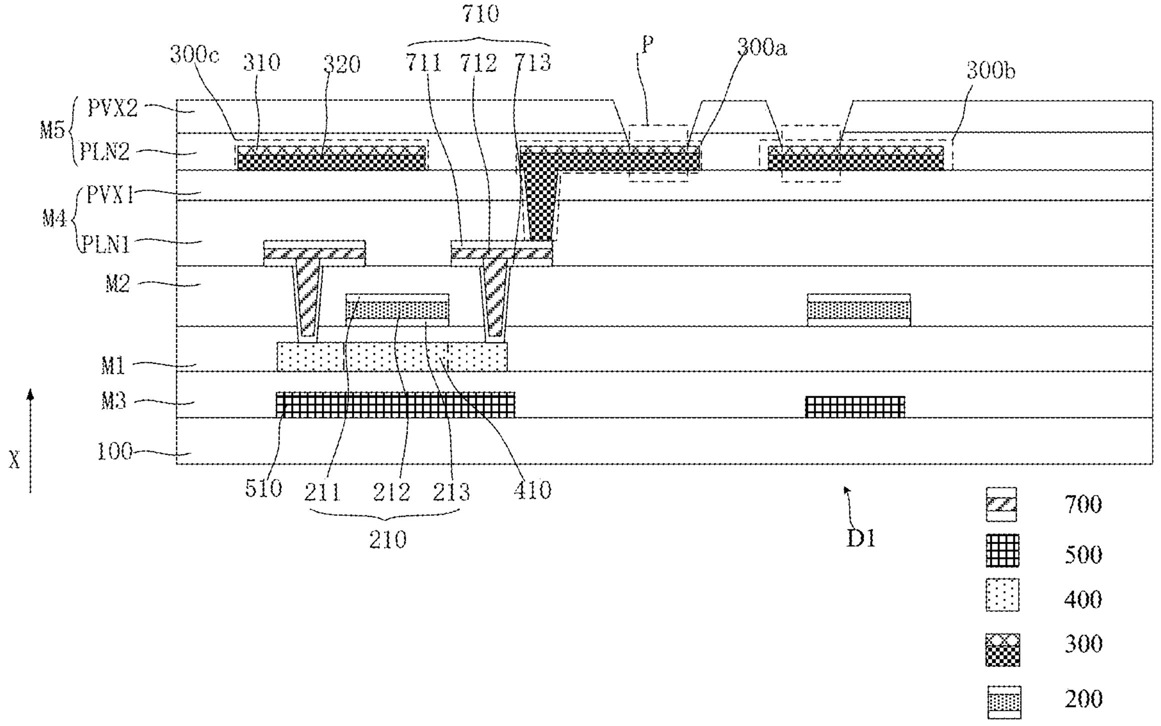
Figure 26:
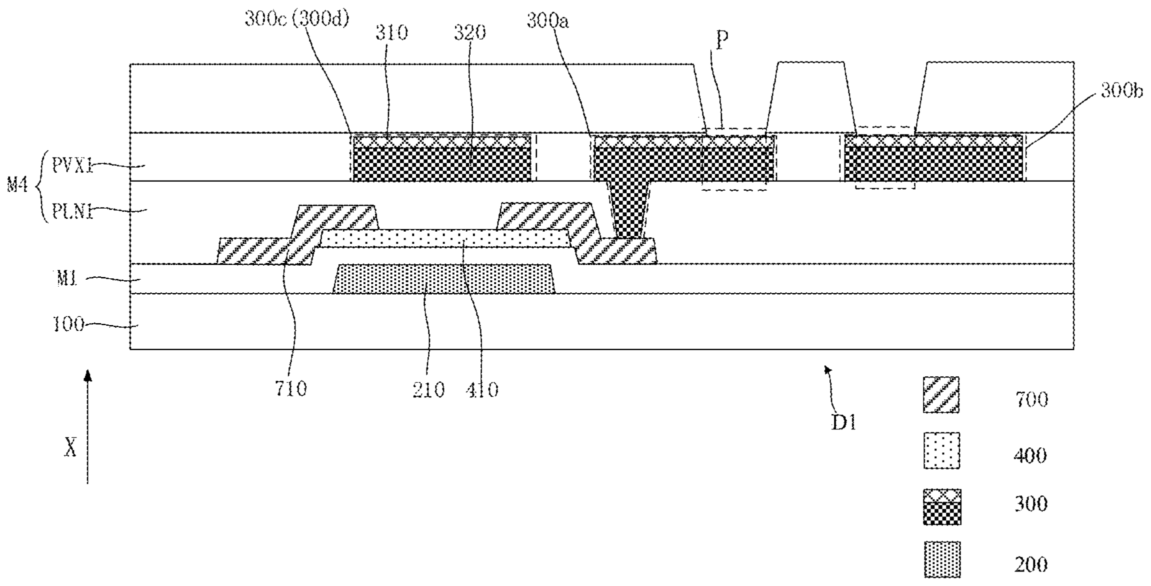
Figure 27:
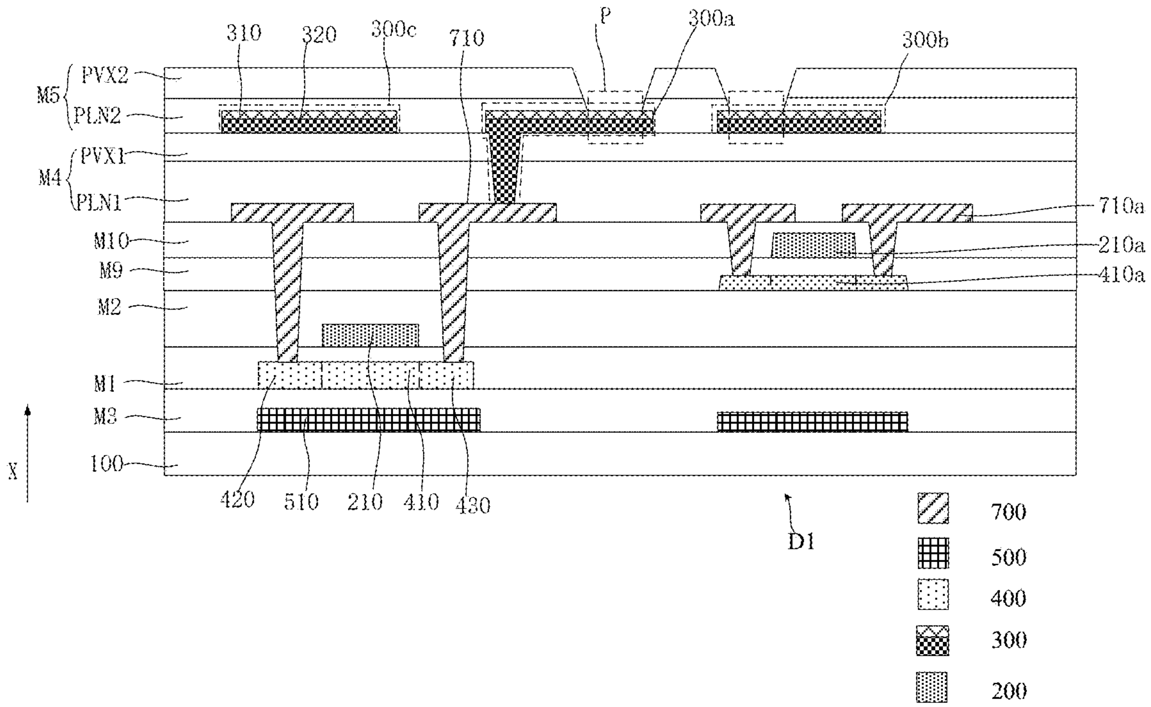
Figure 28A:
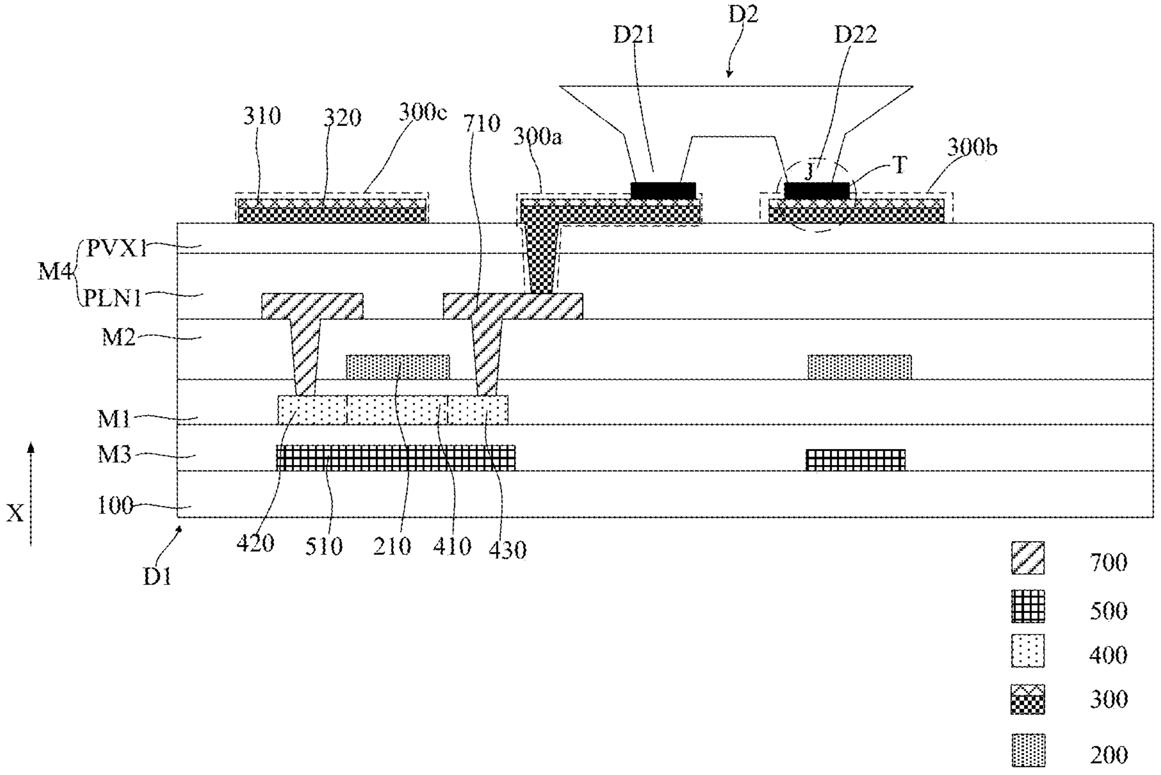
Figure 28B:
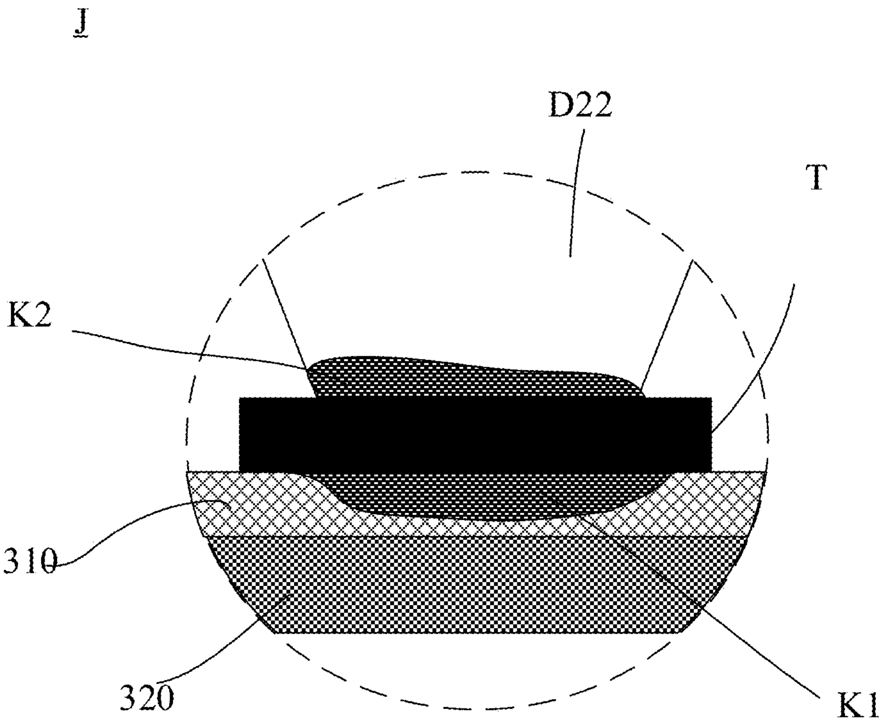

FIG. **7*a*** is a bonding diagram of tin, a pad and nickel, in accordance with some embodiments;

FIG. **7*b*** is a bonding diagram of tin, a pad and tungsten, in accordance with some embodiments;

FIG. **8*a*** is a curve graph of reflectance versus wavelength for nickel, in accordance with some embodiments;

FIG. **8*b*** is a curve graph of reflectivity versus wavelength for copper, in accordance with some embodiments;

FIG. **9*a*** is a histogram of resistivity versus temperature for nickel, in accordance with some embodiments;

FIG. **9*b*** is a histogram of resistivity versus temperature for copper, in accordance with some embodiments;

FIG. 10 is an enlarged view of a second connection portion in FIG. 6;

FIG. 11 is a structural diagram of a stacked structure of another wiring board, in accordance with some embodiments;

FIG. 12 is a structural diagram of a stacked structure of another wiring board, in accordance with some embodiments;

FIG. 13 is a structural diagram of a stacked structure of another wiring board, in accordance with some embodiments;

FIG. 14 is a structural diagram of a stacked structure of another wiring board, in accordance with some embodiments;

FIG. 15 is a structural diagram of a stacked structure of another wiring board, in accordance with some embodiments;

FIG. 16 is an enlarged view of a second connection portion in FIG. 15;

FIG. 17 is a structural diagram of a stacked structure of another wiring board, in accordance with some embodiments;

FIG. 18 is an enlarged view of a second connection portion in FIG. 17;

FIG. 19 is a structural diagram of a stacked structure of another wiring board, in accordance with some embodiments;

FIG. 20 is a structural diagram of a stacked structure of another wiring board, in accordance with some embodiments;

FIG. 21 is an enlarged view of a second connection portion in FIG. 20;

FIG. 22 is a structural diagram of a stacked structure of another wiring board, in accordance with some embodiments;

FIG. 23 is an enlarged view of a second connection portion in FIG. 22;

FIG. 24 is a structural diagram of a stacked structure of another wiring board, in accordance with some embodiments;

FIG. 25 is a structural diagram of a stacked structure of another wiring board, in accordance with some embodiments;

FIG. 26 is a structural diagram of a stacked structure of another wiring board, in accordance with some embodiments;

FIG. 27 is a structural diagram of a stacked structure of another wiring board, in accordance with some embodiments;

FIG. 28*a* is a structural diagram of a stacked structure of a functional backplane, in accordance with some embodiments;

FIG. 28*b* is an enlarged view of a region J in FIG. 28*a;*

Figure 29:
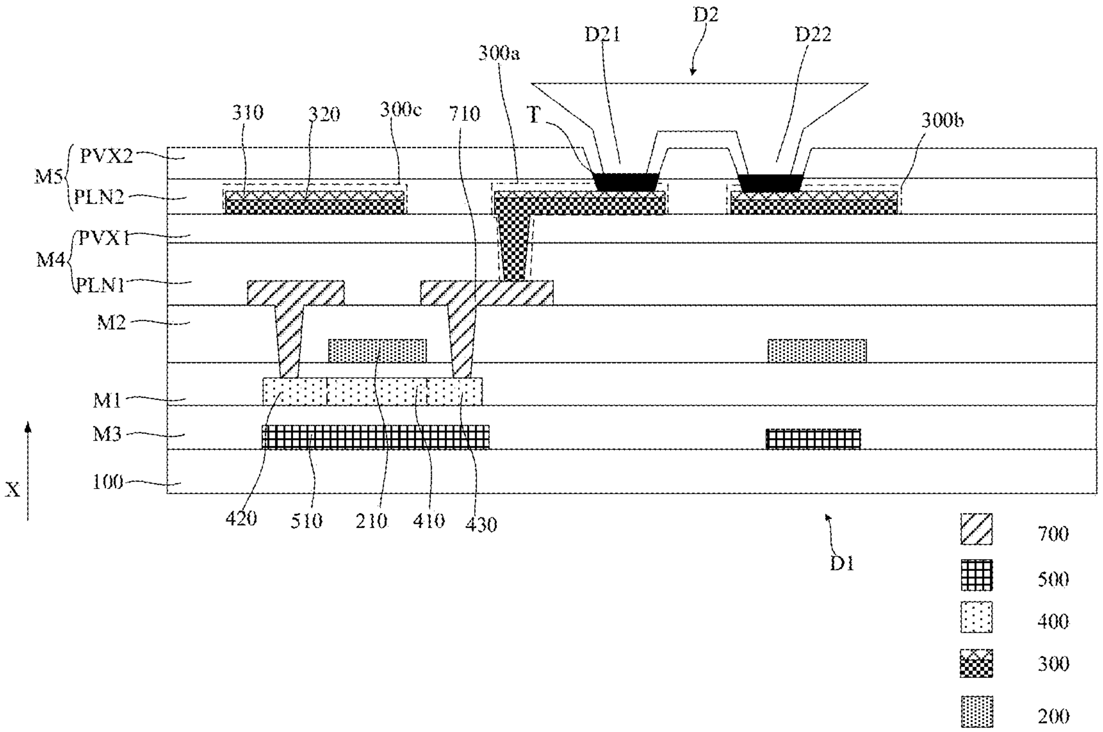
Figure 30:
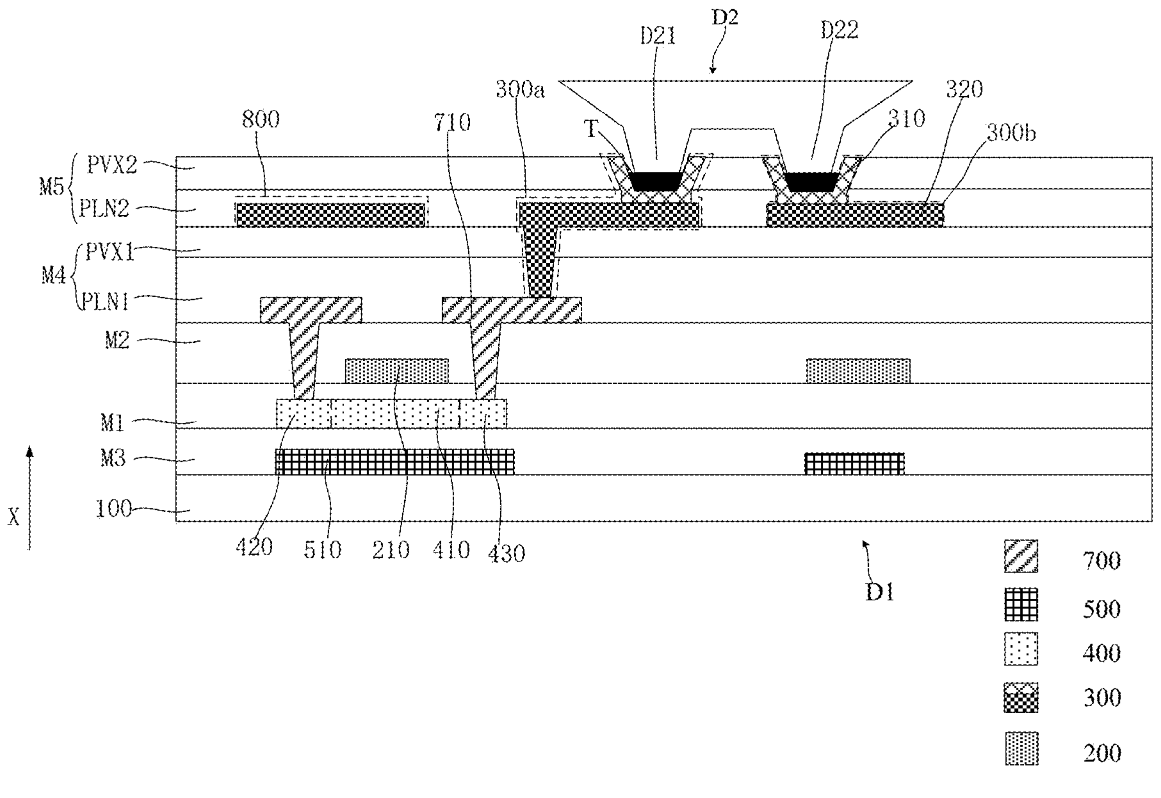
Figure 31:
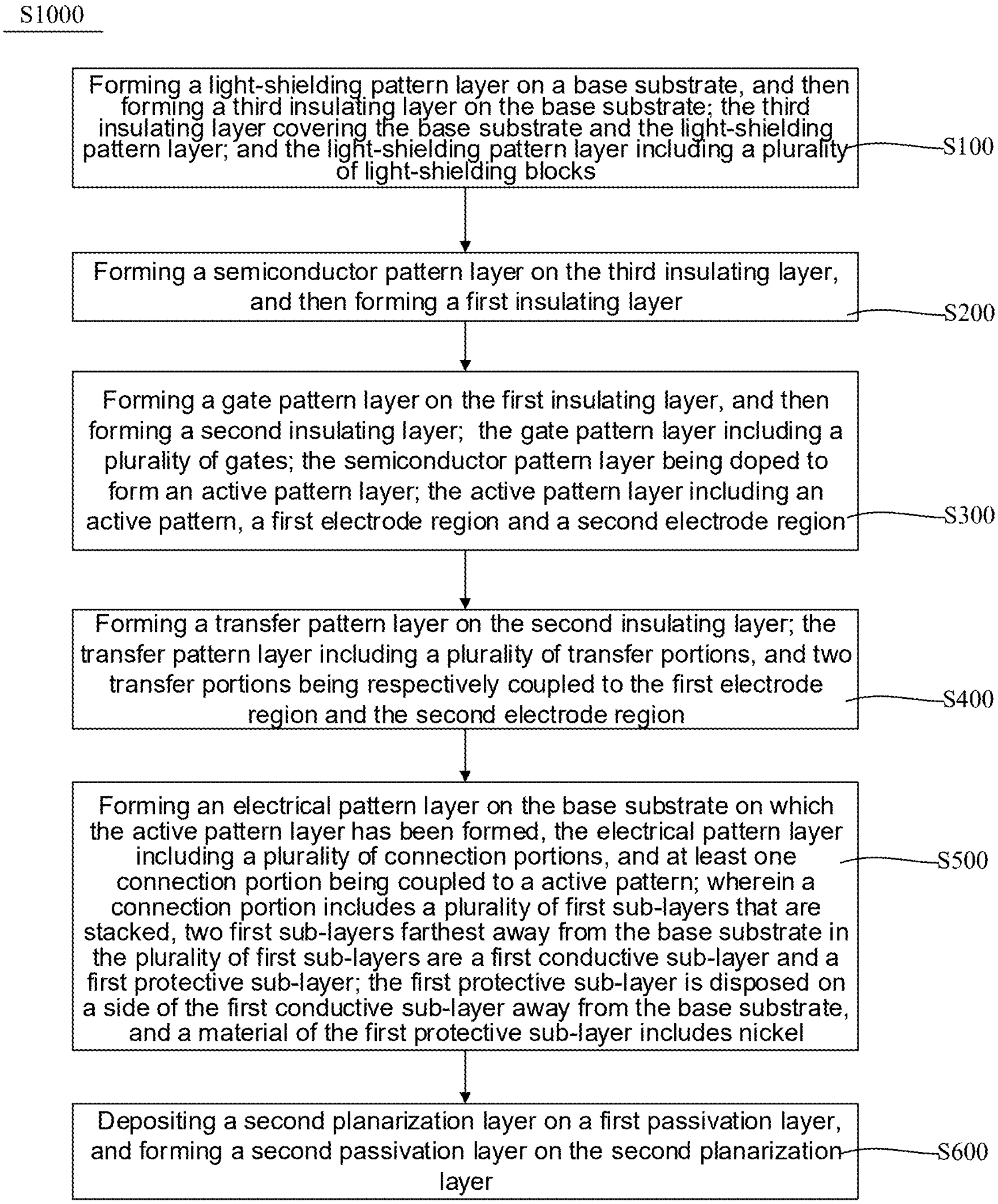

FIG. 29 is a structural diagram of another stacked structure of a functional backplane, in accordance with some embodiments;

FIG. 30 is a structural diagram of another stacked structure of a functional backplane, in accordance with some embodiments;

FIG. 31 is a flow chart of a method for manufacturing a wiring board, in accordance with some embodiments; and FIGS. 32 to 37 are process step diagrams of a method for manufacturing a wiring board.

DESCRIPTION OF THE INVENTION

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term “comprise” and other forms thereof such as the third-person singular form “comprises” and the present participle form “comprising” are construed as open and inclusive, i.e., “including, but not limited to”. In the description of the specification, the terms such as “one embodiment”, “some embodiments”, “exemplary embodiments”, “example”, “specific example” or “some examples” are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as “first” and “second” are used for descriptive purposes only, and are not to be construed as indicating or implying the relative importance or implicitly indicating the number of indicated technical features. Thus, features defined with “first” or “second” may explicitly or implicitly include one or more of the features. In the description of the embodiments of the present disclosure, the term “a plurality of” or “the plurality of” means two or more unless otherwise specified.

In the description of some embodiments, the expressions “coupled” and “connected” and derivatives thereof may be used. For example, the term “connected” may be used in the description of some embodiments to indicate that two or more components are in direct physical or electrical contact with each other. As another example, the term “coupled” may be used in the description of some embodiments to indicate that two or more components are in direct physical or electrical contact. However, the term “coupled” or “communicatively coupled” may also mean that two or more components are not in direct contact with each other, but still cooperate or interact with each other. The embodiments disclosed herein are not necessarily limited to the content herein.

The phrase “at least one of A, B and C” has a same meaning as the phrase “at least one of A, B or C”, and they both include the following combinations of A, B and C: only A, only B, only C, a combination of A and B, a combination of A and C, a combination of B and C, and a combination of A, B and C.

The phrase “A and/or B” includes the following three combinations: only A, only B, and a combination of A and B.

The phrase “applicable to” or “configured to” as used herein indicates an open and inclusive expression, which does not exclude apparatuses that are applicable to or configured to perform additional tasks or steps.

In addition, the use of the phrase “based on” is meant to be open and inclusive, since a process, step, calculation or other action that is “based on” one or more of the stated conditions or values may, in practice, be based on additional conditions or values exceeding those stated.

The term “about”, “substantially” or “approximately” as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as “parallel”, “perpendicular” or “equal” as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term “parallel” includes absolute parallelism and approximate parallelism, and an acceptable range of deviation of the approximate parallelism may be a deviation within 5°; the term “perpendicular” includes absolute perpendicularity and approximate perpendicularity, and an acceptable range of deviation of the approximate perpendicularity may also be a deviation within 5°; and the term “equal” includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus. The display apparatus may be any apparatus that displays images whether in motion (such as a video) or fixed (such as a still image), and regardless of text or image. More specifically, the display apparatus may include, for example, a mobile phone, a tablet computer (pad), a notebook computer, a television, a personal digital assistant (PDA), an ultra-mobile personal computer (UMPC), a netbook, a wearable device (such as a smart watch), a virtual reality (VR) display apparatus, an augmented reality (AR) display apparatus or a vehicle-mounted display apparatus. The present embodiments do not limit the type of the display apparatus.

Figure 1:
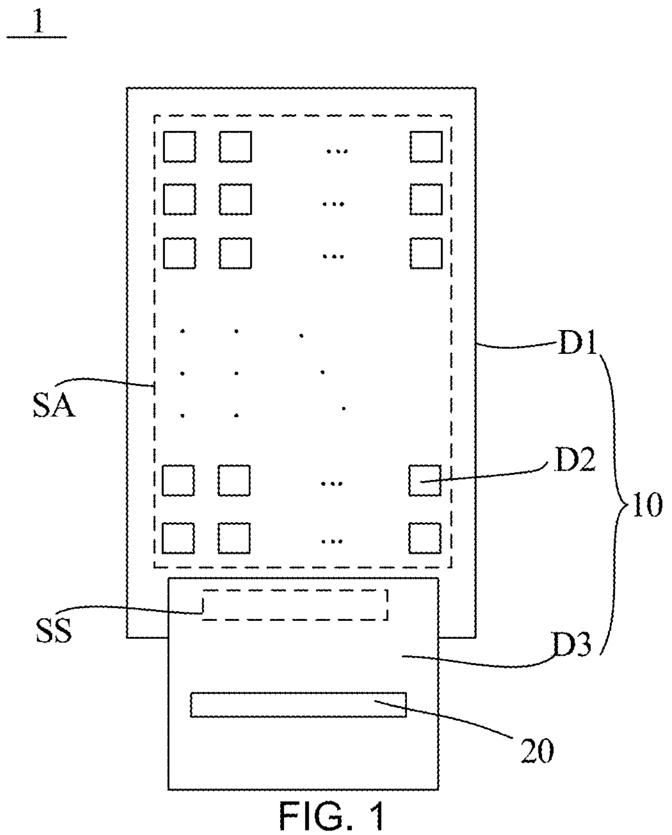
FIG. 1 is a structural diagram of a display apparatus, in accordance with some embodiments.

In some embodiments, referring to FIG. 1, the display apparatus includes a display module 1, and may further include a frame (e.g., a middle frame). The display module 1 is a component configured to display a picture. The frame is configured to fix the display module 1.

The display module 1 includes a functional backplane 10 for displaying pictures. In this case, the functional backplane 10 may be called a display substrate or a display panel. Depending on different display principles, the display panel may be a self-luminous display panel such as a mini LED display panel or a micro LED display panel.

The functional backplane 10 includes a wiring board D1 and electronic components D2. The electronic components D2 may be light-emitting devices such as mini LEDs or micro LEDs. The wiring board D1 has a device region SA and a bonding region SS. The device region SA of the wiring board D1 constitutes a display region (i.e., a region used for displaying pictures), and the light-emitting devices may be coupled to the display region of the wiring board D1. The wiring board D1 is configured to receive data signals and control brightness of the light-emitting devices based on the data signals, so as to display a picture.

The functional backplane 10 may further include a circuit board D3, which may be, for example, a flexible printed circuit (FPC). The circuit board D3 is coupled to the wiring board D1. For example, the circuit board D3 may be bonded to the bonding region SS of the wiring board D1.

In addition, the display module 1 may further include a driver circuit 20, which may specifically be a driver integrated circuit (IC), such as a source driver IC or a display driver integrated circuit (DDIC). The driver circuit 20 is coupled to the functional backplane 10 (i.e., the display panel) and is configured to provide data signals for the functional backplane 10. For example, the driver circuit 20 may be disposed on the circuit board D3 and coupled to the wiring board D1 through the circuit board D3, so as to send the data signals to the wiring board D1.

Figure 2:
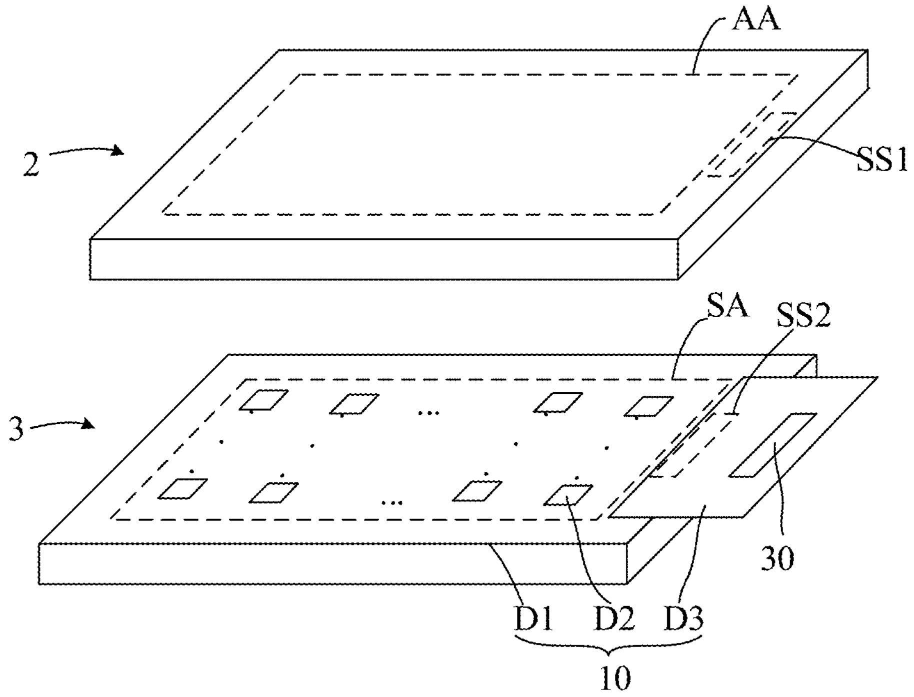
FIG. 2 is a structural diagram of another display apparatus, in accordance with some embodiments.

In some other embodiments, referring to FIG. 2, the display apparatus includes a display panel 2, and may further include a backlight module 3. The display panel 2 may be a liquid crystal display panel. The display panel 2 has a display region AA and a bonding region (referred to as a first bonding region SS1 in the present embodiments). The display region AA is a region used for displaying pictures, the first bonding region SS1 is a region used for being coupled to the circuit board (e.g., the flexible circuit board), and the first bonding region SS1 may be provided on at least one side (e.g., one side, or multiple sides) of the display region AA.

The backlight module 3 is configured to provide light source for the display panel 2. The backlight module 3 includes a functional backplane 10 for providing the light source. In this case, the functional backplane 10 may be called a light-emitting substrate.

The functional backplane 10 includes a wiring board D1 and electronic components D2. The electronic components D2 may be light-emitting devices such as mini LEDs or micro LEDs. The wiring board D1 has a device region SA and a bonding region (referred to as a second bonding region SS2 in the present embodiments). The device region SA of the wiring board D1 is a region used for emitting light. For example, an area of the device region SA of the wiring board D1 may be larger than or equal to that of the display region AA of the display panel 2. For example, in a thickness direction of the display panel 2, an orthographic projection of the display region AA of the display panel 2 on the wiring board D1 falls within the device region SA of the wiring board D1, so that each pixel in the display region AA of the display panel 2 can be irradiated on by light emitted by the light-emitting devices in the device region, and thus the display panel 2 may achieve display.

For example, a plurality of electronic components D2 (e.g., light-emitting devices) installed on the wiring board D1 may be divided into a plurality of light-emitting groups, and each light-emitting group may include at least one electronic component D2. For example, each light-emitting group may include a single electronic component D2. As another example, each light-emitting group includes at least two electronic components D2 connected in series. The wiring board D1 is configured to receive a dimming signal and control brightness of each electronic component D2 in each light-emitting group based on the dimming signal.

The functional backplane 10 may further include a circuit board D3, which may be, for example, a flexible printed circuit. The circuit board D3 is coupled to the wiring board D1. For example, the circuit board D3 may be bonded to the bonding region (called the second bonding region SS2 in the present embodiments) of the wiring board D1. The relative position of the second bonding region SS2 and the device region SA on the wiring board D1 is the same as the relative position of the first bonding region SS1 and the display region AA on the display panel 2. For example, the second bonding region SS2 is located on the right side of the device region SA, and the first bonding region SS1 is also located on the right side of the display region AA, which is beneficial to reducing the frame of the display apparatus.

In addition, the backlight module 3 may further include a dimming circuit 30. The dimming circuit 30 is coupled to the functional backplane 10 (i.e., the light-emitting substrate) and is configured to provide a dimming signal for the functional backplane 10. For example, the dimming circuit 30 may be disposed on the circuit board D3 and coupled to the wiring board D1 through the circuit board D3, so as to send the dimming signal to the wiring board D1.

In yet other embodiments, the type of the electronic component D2 in the functional backplane 10 shown in FIG. 1 or FIG. 2 above may change to achieve a corresponding function. For example, the electronic component D2 in the functional backplane 10 may be a driver component (e.g., a driver or a driver chip) or a sensing device. The sensing device may be a photosensitive element (e.g., a photodiode), a pressure sensitive element or a temperature sensing element. For example, the electronic component D2 may be a photosensitive element, and the functional backplane 10 including such an electronic component D2 may be applied to an electronic device such as a fingerprint identifier. Hereinafter, the functional backplane 10 mentioned above will be described in detail.

Figure 3:
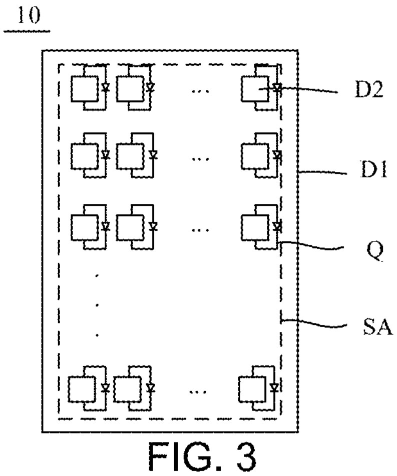
FIG. 3 is a structural diagram of a functional backplane, in accordance with some embodiments.

Referring to FIG. 3, the functional backplane 10 includes a wiring board D1 and a plurality of electronic components D2 disposed on the wiring board D1 and electrically connected to the wiring board D1. The wiring board D1 is configured to provide an electrical signal (e.g., a current or a voltage) for each electronic component D2 to drive the electronic component D2 to operate.

In some embodiments, the wiring board D1 may include a plurality of pixel circuits Q (which may also be referred to as minimum repetition driving circuits). A pixel circuit Q is electrically connected to an electronic component D2 and is configured to provide an electrical signal for the electronic component D2. In addition, the magnitude of the electrical signal provided by the pixel circuit Q may be adjusted, so that an operating state of the electronic component D2 may be adjustable. For example, the electronic component D2 is a light-emitting device, and a pixel circuit Q is electrically connected to a light-emitting device and is configured to provide an electrical signal with adjustable magnitude for the light-emitting device, so that the brightness of the light-emitting device is adjustable.

In some embodiments, the pixel circuit Q may include a plurality of transistors and at least one (e.g., one or more) capacitor. For example, the pixel circuit Q may include three transistors and one capacitor to constitute a 3T1C structure. Of course, the pixel circuit Q may alternatively include more than three transistors and at least one capacitor to constitute a 4T1C structure (i.e., four transistors and one capacitor), a 5T1C structure (i.e., five transistors and one capacitor), or a 7T1C structure (i.e., seven transistors and one capacitor).

The description is made by considering an example where the transistors in the embodiments of the present disclosure are thin film transistors, but the transistors are not limited to the thin film transistors and may also be field effect transistors.

The transistor includes a gate, a source, a drain, and an active pattern connected between the source and the drain. The material of the active pattern may include an oxide semiconductor. For example, the oxide semiconductor may include one or a combination of indium gallium zinc oxide (IGZO), indium zinc tin oxide, indium gallium tin oxide (IGTO), indium zinc oxide (IZO) and a C-axis aligned crystalline (CAAC) structure. Accordingly, the transistor may be an oxide transistor (also called an oxide thin film transistor). The material of the active pattern may also include polysilicon (P—Si). Accordingly, the transistor may be a polysilicon transistor. In the transistor, the active pattern may exhibit a conductive property under driven by voltages at the gate and the source to cause the source and the drain to be on, or exhibit an insulating property to cause the source and the drain to be off. Hereinafter, a layer including a plurality of active patterns is referred to as an active pattern layer.

In some embodiments, all transistors in the pixel circuit Q have the same type, for example, are all oxide transistors or all polysilicon transistors. In some other embodiments, transistors in the pixel circuit Q have at least two types. For example, the pixel circuit Q may include some oxide transistors and some polysilicon transistors.

In some embodiments, all transistors in the pixel circuit Q are P-type transistors. It will be noted that, the embodiments of the present disclosure include, but are not limited to that all the transistors in the pixel circuit Q are P-type transistors. For example, one or more transistors in the pixel circuit Q provided in the embodiments of the present disclosure may adopt N-type transistor(s), for connections of all electrodes of the N-type transistor(s), reference may be made to connections of all electrodes of corresponding P-type transistor(s) in the embodiments of the present disclosure, and corresponding gate(s) are provided with corresponding high voltages.

Figure 4:
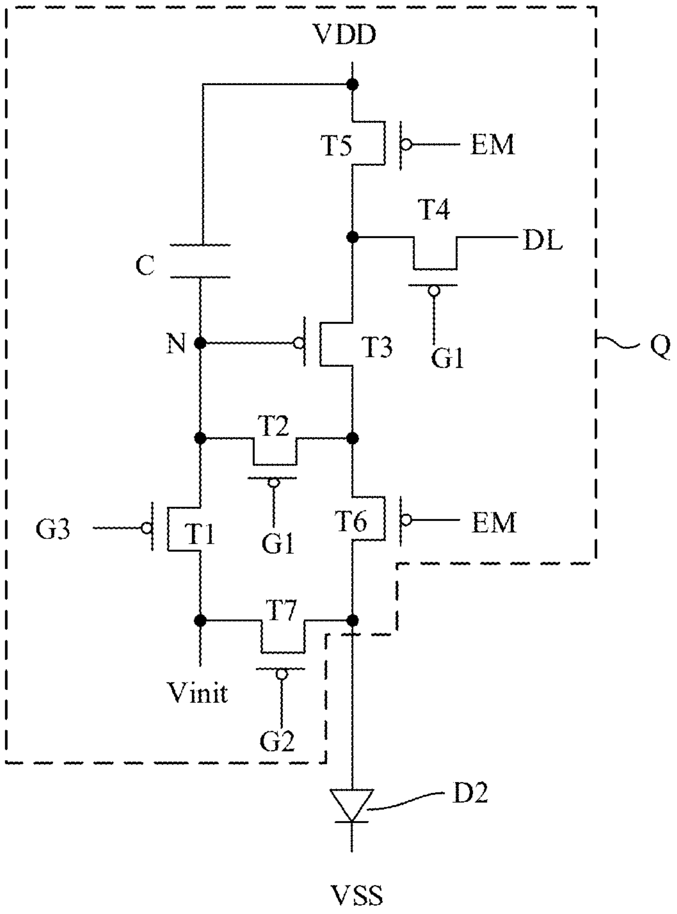
FIG. 4 is a circuit diagram of a pixel circuit, in accordance with some embodiments.

Referring to FIG. 4, the pixel circuit Q includes a first transistor T1, a second transistor T2, a third transistor T3, a fourth transistor T4, a fifth transistor T5, a sixth transistor T6, a seventh transistor T7 and a capacitor C. The embodiments of the present disclosure are illustrated by considering an example where the first transistor T1 to the seventh transistor T7 are all P-type transistors. The third transistor T3 is a driving transistor. A gate of the third transistor T3 is coupled to a node N. Each transistor includes a gate, a first electrode and a second electrode. For a transistor, one of the first electrode and the second electrode is a source, and the other thereof is a drain. For example, the first electrode is the drain, and the second electrode is the source.

The gate of the third transistor T3 is coupled to the node N.

A gate of the first transistor T1 is coupled to a first reset signal terminal G3, a first electrode of the first transistor T1 is coupled to an initialization signal terminal Vinit, and a second electrode of the first transistor T1 is coupled to the node N.

A gate of the second transistor T2 is coupled to a gate line G1, a first electrode of the second transistor T2 is coupled to a second electrode of the third transistor T3, and a second electrode of the second transistor T2 is coupled to the node N. A gate of the fourth transistor T4 is coupled to the gate line G1, a first electrode of the fourth transistor T4 is coupled to a data line DL, and a second electrode of the fourth transistor T4 is coupled to a first electrode of the third transistor T3.

A gate of the fifth transistor T5 is coupled to a light emission control signal terminal EM, a first electrode of the fifth transistor T5 is coupled to a first power supply voltage terminal VDD, and a second electrode of the fifth transistor T5 is coupled to the first electrode of the third transistor T3.

A gate of the sixth transistor T6 is coupled to the light emission control signal terminal EM, a first electrode of the sixth transistor T6 is coupled to the second electrode of the third transistor T3, and a second electrode of the sixth transistor T6 is coupled to a first electrode (e.g., an anode) of an electronic component D2. A second electrode (e.g., a cathode) of the electronic component D2 is coupled to a second power supply voltage terminal VSS.

A gate of the seventh transistor T7 is coupled to a second reset signal terminal G2, a first electrode of the seventh transistor T7 is coupled to the initialization signal terminal Vinit, and a second electrode of the seventh transistor T7 is coupled to the first electrode of the electronic component D2.

An end of the capacitor C is coupled to the node N, and another end of the capacitor C is coupled to the first power supply voltage terminal VDD.

A voltage provided by the first power supply voltage terminal VDD may be greater than a voltage provided by the second power supply voltage terminal VSS, and may also be greater than a voltage provided by the initialization signal terminal Vinit. In addition, for example, the gate line G1, the first reset signal terminal G3, and the second reset signal terminal G2 may each provide a respective signal, that is, signals provided by the gate line G1, the first reset signal terminal G3, and the second reset signal terminal G2 may be different. As another example, the first reset signal terminal G3 and the second reset signal terminal G2 may provide the same signal (in this case, the first reset signal terminal G3 and the second reset signal terminal G2 may be coupled), and the signal provided by the first reset signal terminal G3 and the second reset signal terminal G2 is different from a signal provided by the gate line G1. As another example, the second reset signal terminal G2 and the gate line G1 may provide the same signal (in this case, the second reset signal terminal G2 and the gate line G1 may be coupled), and the signal provided by the second reset signal terminal G2 and the gate line G1 is different from a signal provided by the first reset signal terminal G3.

Figure 5:
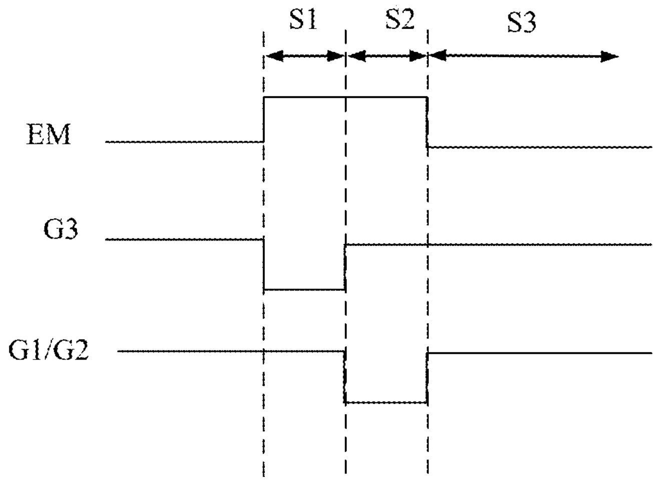
FIG. 5 is a timing control diagram corresponding to a pixel circuit.

Referring to FIG. 5, for example, an operating process of the pixel circuit Q includes the following phases.

In a reset phase (S1 phase), the first transistor T1 is turned on in response to a signal provided by the first reset signal terminal G3 to transmit a signal (e.g., may be called an initialization signal) provided by the initialization signal terminal Vinit to the node N, so as to reset the node N.

In a data writing phase (S2 phase), the second transistor T2 and the fourth transistor T4 are both turned on in response to a scan signal provided by the gate line G1 to write a data signal (e.g., marked as Vdate) provided by the data line DL to the node N and start charging the capacitor C. The voltage at the N node may be a compensated data signal (e.g., Vdate+Vth), where Vth is a threshold voltage of the third transistor. The seventh transistor T7 is turned on in response to a signal provided by the second reset signal terminal G2 to transmit the initialization signal provided by the initialization signal terminal Vinit to the first electrode of the electronic component D2, so as to reset the first electrode of the electronic component D2.

In a light emission phase (S3 phase), the fifth transistor T5 and the sixth transistor T6 may both be turned on in response to a signal provided by the light emission control signal terminal EM to form a conductive path from the first power supply voltage terminal VDD, through the fifth transistor T5, the third transistor T3, the sixth transistor T6 and the electronic component D2 sequentially, to the second power supply voltage terminal VSS, so that the electronic component D2 may operate (e.g., emit light).

For example, the transistors in the above pixel circuit Q may all be polysilicon transistors. As another example, the first transistor T1 and the second transistor T2 in the above pixel circuit Q may be oxide thin film transistors, so as to reduce leakage currents of the first transistor T1 and the second transistor T2, thereby maintaining the voltage at the node N well; and other transistors may be polysilicon transistors.

In the related art, pins of the electronic component D2 and connection portions (also called pads P) with at least part of exposed surfaces of the wiring board D1 achieve fixed connection by soldering a material in a reflow soldering or dip soldering processes. In order to complete the fixed connection between the electronic component D2 and the wiring board D1, the soldering material (called a first soldering material T such as a material containing a metal tin) needs to be provided on the surface of the connection portion, or the soldering material needs to be provided on the pin of the electronic component D2. Then, the pins of the electronic component D2 are aligned with and in contact with the connection portions. For example, the soldering material is melted at a high temperature of 230° C. to 260° C., and the soldering material and the connection portion are well moistened, then the soldering material is quickly cooled down, so as to fixedly connect the electronic component D2 to the wiring board D1.

In a case where the electronic component D2 appears to have false soldering or soldering position offset, the electronic component D2 needs to be removed by applying a lateral shearing force thereon and re-soldered firmly at the correct position. During removal of the electronic component D2, the connection portions of the wiring board D1 may be damaged, thereby causing the connection portions to be unable to be soldered to the electronic component D2 again.

In order to solve the problem, FIG. 6 shows a stacked structure of a wiring board and a relative position of an electronic component on the wiring board. Referring to FIG. 6, the wiring board D1 includes a base substrate 100, an active pattern layer 400 and an electrical pattern layer 300.

The structure of the base substrate 100 may be provided according to actual needs. For example, the base substrate 100 may be a rigid substrate. The rigid substrate may include, for example, a glass substrate, a quartz substrate, or a plastic substrate. In this case, the wiring board D1 is rigid. Alternatively, the base substrate 100 may be a flexible substrate. The flexible substrate may include, for example, a polyimide substrate, a polymethyl methacrylate substrate, or a polyethylene naphthalate substrate. In this case, the wiring board D1 is flexible.

The base substrate 100 may be of a single-layer structure or a multi-layer structure. For example, the base substrate 100 may include at least one flexible substrate and at least one buffer layer, and the flexible substrate(s) and the buffer layer(s) are alternately arranged in stack.

With continued reference to FIG. 6, the active pattern layer 400 is disposed on a side of the base substrate 100. The active pattern layer 400 includes a plurality of active patterns 410, and the active pattern 410 is, for example, an active pattern 410 of a transistor in the above pixel circuit Q. For example, the transistor may be a polysilicon transistor, and the transistor (or the active pattern layer 400) has an active region, and a first electrode region 420 and a second electrode region 430 located on opposite sides of the active region. A portion of the active pattern layer 400 located in the active region may be referred to as the active pattern 410. One of the first electrode region 420 and the second electrode region 430 is a source region (which may be used as a source), and the other thereof is a drain region (which may be used as a drain). The material of the first electrode region 420 and the second electrode region 430 may be doped polysilicon and appears conductive.

Referring to FIG. 6, the electrical pattern layer 300 is disposed on a side of the active pattern layer 400 away from the base substrate 100. The electrical pattern layer 300 includes a plurality of connection portions. At least one (e.g., one or more) connection portion is coupled to an active pattern 410. In order to describe the solution clearly, the connection portion coupled to the active pattern 410 may be referred to as a first connection portion **300*a***.

For example, there may be one first connection portion 300*a* coupled to the active pattern 410, and the first connection portion 300*a* may be coupled to any of the first electrode region 420 and the second electrode region 430 located on both sides of the active pattern 410. For example, the first connection portion 300*a* is coupled to the second electrode region 430. Based on this, when the transistor including the active pattern 410 operates, the first connection portion 300*a* and the second electrode region 430 may have the same potential, thus may be equivalent to the same point in the equivalent circuit of the pixel circuit Q.

As another example, there may be two first connection portions 300*a* coupled to the active pattern 410, one of the first connection portions 300*a* is coupled to the first electrode region 420 located on a side of the active pattern 410, and another of the first connection portion 300*a* is coupled to the second electrode region 430 located on another side of the active pattern 410.

It can be seen from the above description for FIGS. 3 and 4 that there is a coupling relationship between the pixel circuit Q and the electronic component D2. At least one active pattern 410 in the pixel circuit Q is coupled to the electronic component D2. For example, in FIG. 4, the active pattern 410 of the sixth transistor T6 and the active pattern 410 of the seventh transistor T7 are both coupled to the electronic component D2.

The electronic component D2 may include a pin (called a first pin D21 (e.g., a positive electrode)) coupled to at least one active pattern 410. The first pin D21 may be coupled to a first connection portion 300*a*, and is coupled to the at least one active pattern 410 by the first connection portion 300*a*. In addition, the electronic component D2 may further include another pin such as a second pin D22 (e.g., a negative electrode). The plurality of connection portions in the electrical pattern layer 300 may further include a connection portion coupled to the second pin D22 of the electronic component D2, and the connection portion is referred to as a second connection portion 300*b*. For example, the second connection portion 300*b* may be coupled to the second power supply voltage terminal VSS in FIG. 4, so that the second pin D22 of the electronic component D2 is coupled to the second power supply voltage terminal VSS by the second connection portion 300*b*.

In addition, the plurality of connection portions in the electrical pattern layer 300 may further include a third connection portion 300*c*. In an example, the third connection portion 300*c* is coupled to the first power supply voltage terminal VDD in FIG. 4 and is configured to provide a power supply voltage (e.g., a power supply voltage provided for the anode of the electronic component D2) for the above pixel circuit Q.

The connection portion (the first connection portion 300*a*, the second connection portion 300*b* or the third connection portion 300*c*) includes a plurality of first sub-layers stacked in a thickness direction of the base substrate 100 (an X direction shown in FIG. 6). Two first sub-layers farthest away from the base substrate 100 (two uppermost first sub-layers) in the plurality of first sub-layers are a first conductive sub-layer 320 and a first protective sub-layer 310, and the first protective sub-layer 310 is disposed on a side of the first conductive sub-layer 320 away from the base substrate 100. For example, the connection portion includes two first sub-layers, which are a first conductive sub-layer 320 and a first protective sub-layer 310. As another example, the connection portion includes more than three (e.g., three, four, five or more) first sub-layers, which are, for example, from top to bottom, a first protective sub-layer 310, a first conductive sub-layer 320 and at least one other sub-layer.

Since in the plurality of first sub-layers, the first protective sub-layer 310 is disposed on a side of the first conductive sub-layer 320 away from the base substrate 100, the first soldering material T (with a main component of tin (Sn)) may be used to solder the pin of the electronic component D2 (e.g., the first pin D21 or the second pin D22) to the first protective sub-layer 310. During this process, the first soldering material T and the first protective sub-layer 310 form a first intermetallic compound. In addition, the first soldering material T and the pin of the electronic component D2 form a third intermetallic compound. Thus, the soldering between the electronic component D2 and the wiring board D1 may be achieved.

A compound formed by metal and metal or by metal and metalloid (e.g., H, B, N, S, P, C and Si) is referred to as an intermetallic compound (IMC). Elements in the intermetallic compound bond by metallic bonds to maintain metallic properties. The intermetallic compound is a product of an interfacial reaction. During soldering the pin 30 of the electronic component 20 to the first protective sub-layer 310 using the first soldering material T, the first soldering material T is melted by heating first; then, the material of the first protective sub-layer 310 is melted, and the material of the pin 30 of the electronic component 20 is melted simultaneously; next, metal atoms in the first soldering material T diffuse and react with both metal atoms in the first protective sub-layer 310 and metal atoms in the pin 30, so that the metal atoms in the first soldering material T and the metal atoms in the first protective sub-layer 310 form the first intermetallic compound, and the metal atoms in the first soldering material T and the metal atoms in the pin 30 form the third intermetallic compound. In addition, as the first soldering material T continues to diffuse, the metal atoms in the first soldering material T and metal atoms in the first conductive sub-layer 320 may further form a fourth intermetallic compound.

It can be understood that a rate of forming the intermetallic compound is related to composition, melting point, temperature and reaction time of the material. In addition, as diffusion proceeds, an original contact interface between film layers where two metals with different diffusion coefficients are located will move. Usually, the interface will move toward the film layer where the metal with a larger diffusion coefficient is located. In some cases, nano- or micron-sized cavities or gaps may further be formed in the film layer where the metal with the larger diffusion coefficient is located.

After the first soldering material T and at least part (e.g., a part or all) of the first protective sub-layer 310 form the first intermetallic compound, the first intermetallic compound and a portion of the first protective sub-layer 310 not forming the first intermetallic compound block the first soldering material T to a certain extent, so that the diffusion rate of the first soldering material T is slowed down, thereby effectively preventing the first soldering material T from diffusing into the first conductive sub-layer 320. In this way, even if soldering defects occur (e.g., false soldering occurs or the position of the electronic component D2 is shifted) and maintenance is required, during removing the electronic component D2, the first conductive sub-layer 320 is difficult to remove, which may not cause lack of the first conductive sub-layer 320, thereby improving the repairability rate.

In some examples, the material of the first conductive sub-layer 320 includes copper (e.g., pure copper) or copper alloy. However, copper or copper alloy is prone to be oxidized. In order to prevent the first conductive sub-layer 320 from being oxidized, an oxidation resistance of the first protective sub-layer 310 is higher than an oxidation resistance of the first conductive sub-layer 320. In order to ensure that the first protective sub-layer 310 has a high oxidation resistance, the material of the first protective sub-layer 310 includes nickel. In addition, for example, a material of the protective sub-layer 310 may not include copper. As another example, the material of the first protective sub-layer 310 may include copper; and in the first protective sub-layer 310, an atomic percentage of copper is less than an atomic percentage of nickel.

In some examples, the material of the first protective sub-layer 310 is pure nickel (Ni).

In some other examples, the material of the first protective sub-layer 310 is nickel alloy. For example, in the nickel alloy, nickel has the highest atomic percentage compared to doped metal(s). For example, the material of the first protective sub-layer 310 is nickel alloy with an atomic percentage of nickel (which may be denoted as Ni at %) greater than or equal to 40% (e.g., 40%, 50%, 60%, 70%, 75%, 80%, 90% or 99%). For example, the nickel alloy may be Ni binary, ternary, or quaternary alloy with an atomic percentage of nickel greater than or equal to 40%.

For example, the material of the first protective sub-layer 310 further includes at least one of tungsten (W), vanadium (V), palladium (Pd), aluminum (Al), titanium (Ti), zirconium (Zr), molybdenum (Mo), copper (Cu), yttrium (Y), niobium (Nb), platinum (Pt), tin (Sn), tantalum (Ta), gold (Au) and silver (Ag). The at least one of these doped metals and nickel may form the nickel alloy. For example, the nickel alloy may be NiAl alloy, NiV alloy, NiTi alloy, NiMo alloy, NiCu alloy or NiAg alloy. As another example, in the nickel alloy, all the doped metals may not react with the first soldering material T (e.g., tin), that is, all the doped metals and the first soldering material T cannot form the IMC. As another example, the nickel alloy may be doped with one or more metals that can react with the first soldering material T. The following gives a detailed analysis of benefits of the material of the first protective sub-layer 310 including nickel (Ni).

Ni and Ni alloy have good bonding effects.

Figure 7A:
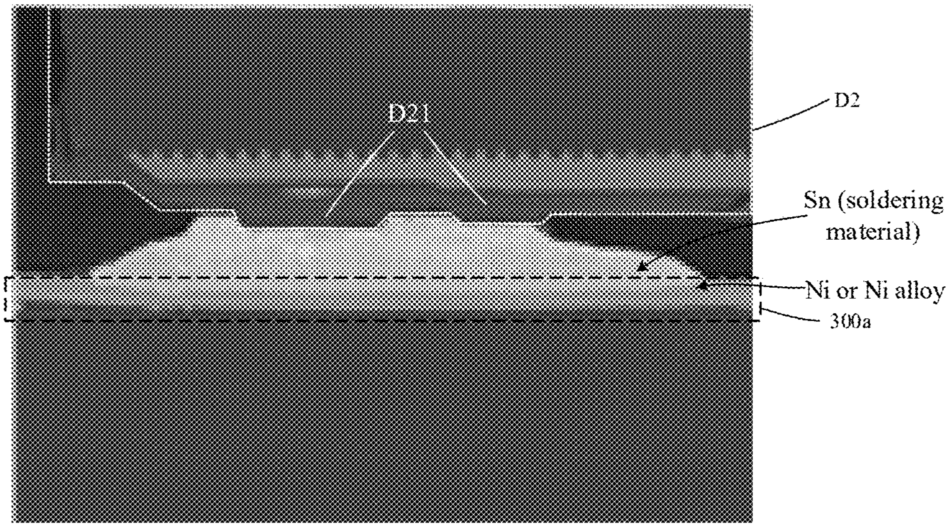

The metals (e.g., metals that can react with tin (Sn) to form an IMC) that react well with soldering materials (e.g., the first soldering material T) include gold (Au), silver (Ag), copper (Cu), nickel (Ni), ferrum (Fe), and the like. Ni and Ni alloy have good bonding effects and good wettability. Moreover, metal doping may improve the oxidation resistance of the Ni alloy. During high-temperature reflow soldering, Ni reacts with Sn in the soldering material to generate an IMC such as $Ni_3Sn_2$, $Ni_3Sn_4$ or $Ni_3Sn_7$. The IMC plays a role of soldering the electronic component D2 to the connection portions of the wiring board D1. Referring to FIG. 7*a*, Ni or Ni alloy (e.g., NiW alloy and NIV alloy) can react with Sn to form the IMC, and has good wettability, so that Sn may be spread on a layer made of Ni or Ni alloy. In addition, Au and Ag belong to noble metal with high cost, and Ag is prone to oxidation. Cu is prone to oxidation, and Cu and Cu alloy are still prone to oxidation after doped with metal(s). Fe is prone to oxidation and corrosion. Therefore, the material of the first protective sub-layer 310 selects Ni or Ni alloy.

Figure 7B:
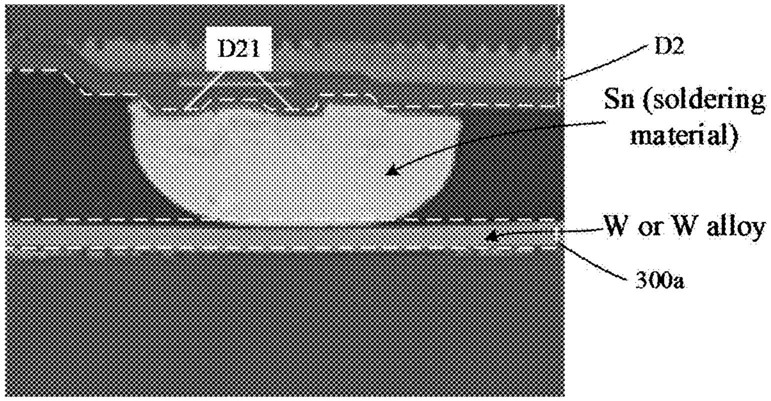

In addition, metals and alloys of molybdenum (Mo), tungsten (W) and titanium (Ti) do not react with Sn, that is, metals and alloys of molybdenum (Mo), tungsten (W) and titanium (Ti) cannot react with Sn to generate the IMC. Such metals or alloys (e.g., WTi alloy, Mo alloy and Ti) are also verified. Referring to FIG. 7*b*, on a layer made of such metals or alloys (exemplified by W or W alloy), Sn forms a Sn ball and shrinks (i.e., indicating poor wettability), and Sn does not react with such metals or alloys.

Oxidation resistance of Ni and Ni alloy may be better than that of Cu alloy.

Figure 8A:
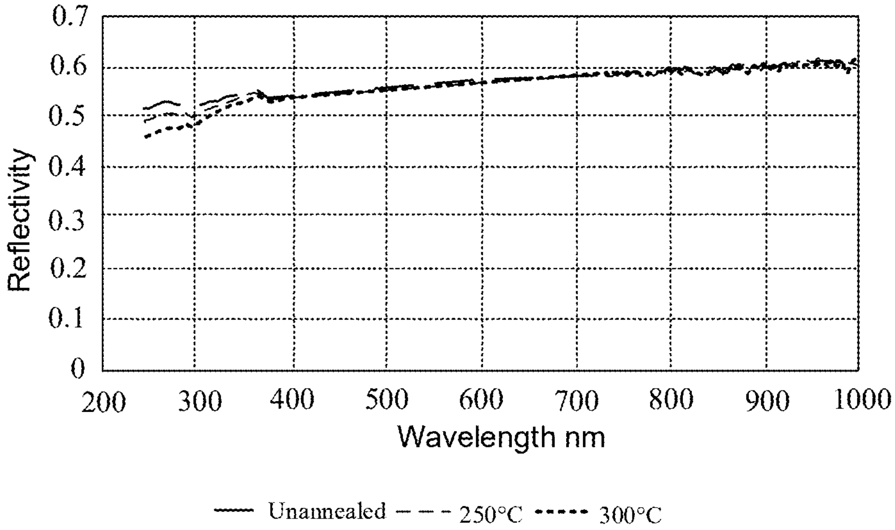
Figure 8B:
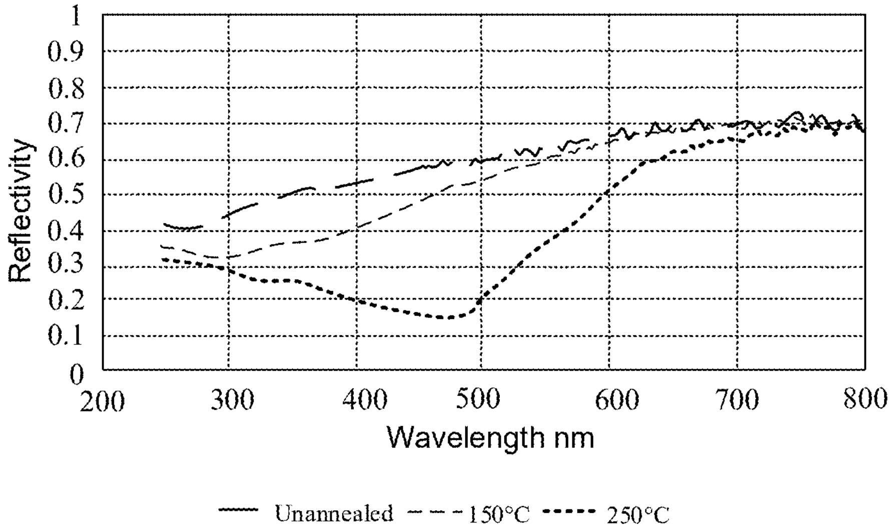
Figure 9A:
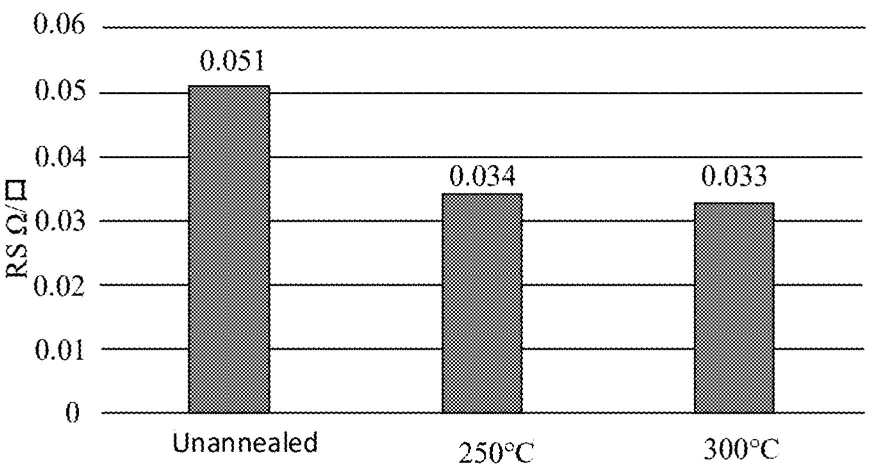
Figure 9B:
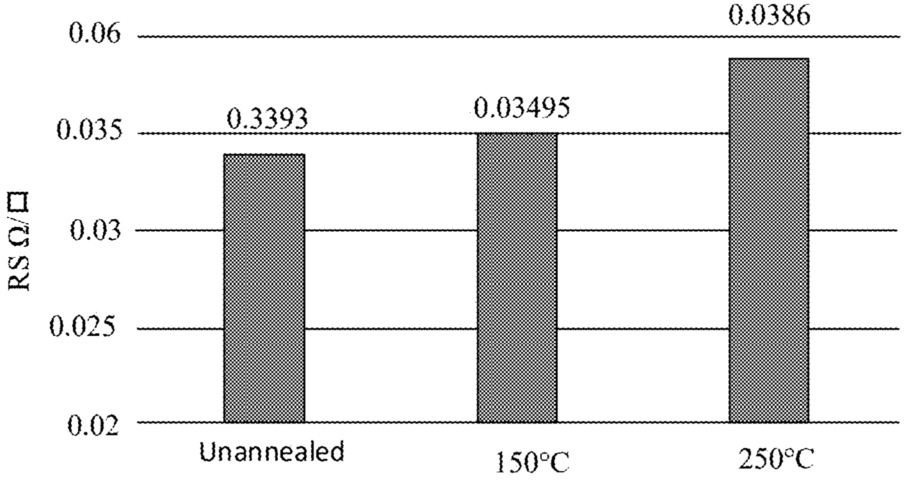

After Ni alloy is annealed at 250° C. or 300° C., the reflectivity does not decrease significantly (as shown in FIG. 8*a*), and the resistance decreases (as shown in FIG. 9*a*). Cu alloy oxidizes when the annealing temperature is above 150° C., resulting in a significant decrease in reflectivity (as shown in FIG. 8*b*) and an increase in resistance (as shown in FIG. 9*b*).

Ni and Ni alloy have strong corrosion resistance.

Under high temperature and high humidity, the corrosion resistance of Ni alloy is greater than the corrosion resistance of Au, and the corrosion resistance of Au is greater than the corrosion resistance of Cu alloy.

Ni alloy has good adhesion.

A single-layer film (denoted as a film 1) with a thickness of 300 Å made of Ni alloy may achieve 5B adhesion performance, while a single-layer film (denoted as a film 2) with a thickness of 6000 Å made of Cu or Cu alloy will undergo severe peeling. If the film 2 is stacked on the film 1 to form a stacked structure, the film 1 serves as a buffer layer for the film 2, so that the adhesion of the film 2 is enhanced, and the stacked structure may achieve 5B performance. For example, the connection portion may further include other first sub-layer(s), and the other first sub-layer(s) are stacked on a side of the first conductive sub-layer 320 away from the first protective sub-layer 310 and are in contact with the first conductive sub-layer 320. The material of the other first sub-layer(s) is Ni or Ni alloy, thereby enhancing the adhesion of the first conductive sub-layer 320.

It is compatible with a conventional manufacturing process, has a low cost, is rather environmental friendly, and has high mass production feasibility.

For example, a layer of Ni or Ni alloy may be deposited first to obtain a film, and the film may be patterned to form the first protective sub-layer 310. This step may use a conventional photolithography process, has a low cost, contains no cyanide and does not pollute the environment. Moreover, since it is compatible with the process used in existing products, it may be adapted to current production lines and is easy to achieve mass production.

As another example, a plurality of films may be deposited in sequence, and then the plurality of films may be patterned together to form the connection portions including a plurality of first sub-layers. Likewise, this step has the above effects and further simplifies the manufacturing process.

In some embodiments, a thickness of the first protective sub-layer 310 is in a range of 80 Å to 5000 Å, inclusive, such as 80 Å, 100 Å, 200 Å, 300 Å, 500 Å, 700 Å, 800 Å, 1000 Å, 1500 Å, 2000 Å, 2500 Å, 3000 Å, 3500 Å, 4000 Å, 4500 Å, or 5000 Å. As the thickness of the first protective sub-layer 310 increases, the first protective sub-layer 310 has an increasing good blocking effect on the first soldering material T, thereby preventing the first soldering material T and the first conductive sub-layer 320 from forming an intermetallic compound. In a case of the thickness of the first protective sub-layer 310 being 80 Å, the first soldering material T (e.g., tin) may diffuse into the first conductive sub-layer 320 and form an intermetallic compound with the first conductive sub-layer 320. In a case of the thickness of the first protective sub-layer 310 being 5000 Å, the first soldering material T cannot penetrate the first protective sub-layer 310, that is, the first soldering material T will not diffuse into the first conductive sub-layer 320. Therefore, the thickness of the first protective sub-layer is 80 Å and 5000 Å, which are two limit values of the first protective sub-layer 310. That is, 80 Å is the minimum limit value and 5000 Å is the maximum limit value.

In some embodiments, with continued reference to FIG. 6, the wiring board D1 further includes a gate pattern layer 200. The gate pattern layer 200 is disposed on the base substrate 100. The gate pattern layer 200 includes a plurality of gates 210, for example, the gates 210 of the transistors in the above pixel circuits.

In embodiments of the present disclosure, the "pattern layer" may be that at least one film layer is formed by using a same film-forming process, and then a patterning process is performed on the at least one film layer to form a layer structure including specific patterns. Depending on different specific patterns, the patterning process may include several photoresist coating, exposure, development and etching processes. The specific patterns in the formed layer structure may be continuous or discontinuous, and these specific patterns may also be at different heights (or have different thicknesses). The gate pattern layer 200 may be made of a metal material, such as at least one of aluminum (Al), silver (Ag), copper (Cu), chromium (Cr), titanium (Ti) or molybdenum (Mo).

In some examples, the gate pattern layer 200 is disposed on a side of the active pattern layer 400 away from the base substrate 100. Based on this, in the pixel circuit, the gate 210 in the gate pattern layer 200 is located above the active pattern 410, and in this case, the transistor corresponding to the gate 210 and the active pattern 410 is a top-gate transistor. In some other examples, the thin film transistors in the pixel circuit may all be top-gate thin film transistors. In still other examples, in the pixel circuit, some transistors are top-gate transistors and some transistors are bottom-gate transistors.

In some embodiments, with continued reference to FIG. 6, the wiring board D1 further includes a first insulating layer M1 and a second insulating layer M2. The first insulating layer M1 separates the active pattern layer 400 and the gate pattern layer 200. The second insulating layer M2 is located on a side of the active pattern layer 400, the gate pattern layer 200 and the first insulating layer M1 away from the base substrate 100.

In a possible implementation, the first insulating layer M1 is disposed on the base substrate 100 and covers the active pattern layer 400. The gate pattern layer 200 is disposed on the first insulating layer M1. The second insulating layer M2 is disposed on the first insulating layer M1 and covers the gate pattern layer 200.

Based on this, the wiring board D1 further includes a plurality of first via holes extending through the second insulating layer M2 and the first insulating layer M1. A first via hole exposes a first electrode region 420 or a second electrode region 430 of a transistor.

With continued reference to FIG. 6, in some embodiments of the present disclosure, the wiring board D1 further includes a transfer pattern layer 700 disposed between the electrical pattern layer 300 and the active pattern layer 400. The transfer pattern layer 700 includes a plurality of transfer portions 710, and the transfer portion 710 is coupled to the active pattern 410 and the connection portion. As mentioned above, the connection portion coupled to the active pattern 410 is called the first connection portion 300*a*. Then, the first connection portion 300*a* may be coupled to the active pattern 410 of the transistor by the transfer portion 710.

In some examples, two transfer portions 710 may be coupled to the first electrode region 420 and the second electrode region 430 of the transistor. A part of the transfer portion 710 may penetrate a first via hole to be in contact with the first electrode region 420 or the second electrode region 430 of the transistor. In addition, for example, one of the two transfer portions 710 may further be coupled to (e.g., in contact with) the first connection portion 300*a*, and the other thereof may not be coupled to a connection portion. As another example, the two transfer portions 710 may respectively be coupled to (e.g., in contact with) two connection portions (e.g., two first connection portions 300*a*) in the electrical pattern layer 300.

In some other examples, first electrodes and second electrodes of some transistors (e.g., the second transistor T2 in FIG. 4) in the pixel circuit are only directly connected to other transistors in the pixel circuit, and do not need to be directly connected to the electronic component D2 or a signal input terminals (e.g., the first power supply voltage terminal VDD, the data line DL, or the initialization signal terminal Vinit). For these transistors, two transfer portions 710 coupled to a transistor are not coupled to the electrical pattern layer 300.

The transfer pattern layer 700 may be made of a metal material, for example, a metal element such as aluminum (Al), silver (Ag), copper (Cu), chromium (Cr) or nickel (Ni), or a metal alloy containing at least one of the above metal elements. The transfer pattern layer 700 may also be a stacked structure, for example, formed by three conductive layers stacked.

In order to reduce the exposure of the active pattern layer 400 to light, with continued reference to FIG. 6, the wiring board D1 further includes a light-shielding pattern layer 500. The light-shielding pattern layer 500 is provided between the active pattern layer 400 and the base substrate 100. In some examples, the material of the light-shielding pattern layer 500 may be a metal material. For details, reference may be made to the relevant introduction of the material of the gate pattern layer 200. For example, the light-shielding pattern layer 500 and the gate pattern layer 200 may be made of the same or different materials. In order to avoid direct contact between the active pattern layer 400 and the light-shielding pattern layer 500, the wiring board D1 further includes a third insulating layer M3 disposed between the light-shielding pattern layer 500 and the active pattern layer 400. For example, the third insulating layer M3 is disposed on the base substrate 100 and covers the light-shielding pattern layer 500. The first insulating layer M1 and the active pattern layer 400 are provided on the third insulating layer M3.

In some examples, the light-shielding pattern layer 500 may include a plurality of light-shielding blocks 510. An orthographic projection of the light-shielding block 510 on the base substrate 100 covers an orthographic projection of the active pattern 410 on the base substrate 100. In this way, light irradiated on the active pattern 410 from a side of the base substrate 100 may be blocked by the light-shielding pattern layer 500, thereby preventing characteristics of the transistor from changing due to illumination. In some other examples, an orthographic projection of a whole of the light-shielding pattern layer 500 on the base substrate 100 covers an orthographic projection of a whole of the active pattern layer 400 on the base substrate 100. Thus, the transistors may be protected well.

With continued reference to FIG. 6, in order to form a relatively flat surface in the wiring board to carry the electrical pattern layer 300, the wiring board D1 may further include a fourth insulating layer M4, and the fourth insulating layer M4 is disposed on the second insulating layer M2. The fourth insulating layer M4 further covers the transfer pattern layer 700.

In some examples, the fourth insulating layer M4 includes a first planarization layer PLN1 and a first passivation layer PVX1. The material of the first planarization layer PLN1 is an organic insulating material, and thus the first planarization layer PLN1 may also be called an organic insulating layer, which may provide a relatively flat upper surface. The material of the first passivation layer PVX1 is an inorganic insulating material, and thus the first passivation layer PVX1 may also be called an inorganic insulating layer, which may play a good insulating effect.

For example, the first passivation layer PVX1 is disposed on a side of the first planarization layer PLN1 away from the base substrate 100. The electrical pattern layer 300 may be disposed on a side of the first passivation layer PVX1 away from the base substrate 100. That is, in the X direction, the first planarization layer PLN1, the first passivation layer PVX1 and the electrical pattern layer 300 are stacked in sequence. As another example, positions of the first planarization layer PLN1 and the first passivation layer PVX1 may be interchanged.

Based on this, the wiring board D1 further includes a plurality of second via holes extending through the fourth insulating layer M4. At least one second via hole exposes the transfer portion 710.

In a possible implementation, a part of the connection portion passes through a second via hole to be in contact with the transfer portion 710. For example, a part of the first connection portion 300*a* passes through a second via hole to be in contact with the transfer portion 710. As another example, a part of the first connection portion 300*a* passes through a second via hole to be in contact with a transfer portion 710, and a part of the third connection portion 300*c* passes through another second through hole to be in contact with another transfer portion 710.

The part of the connection portion may be a conductive sub-layer closest to the base substrate 100 (e.g., the first conductive sub-layer 320 or a second conductive sub-layer 340) and another first sub-layer on a side proximate to the base substrate 100. For example, as shown in FIG. 10, in a case where the first connection portion 300*a* includes a first protective sub-layer 310 and a first conductive sub-layer 320, a part of the connection portion may be the first conductive sub-layer 320 (i.e., the above conductive sub-layer). As another example, as shown in FIG. 23, in a case where the first connection portion 300*a* includes a first protective sub-layer 310, a first conductive sub-layer 320, a second protective sub-layer 330, a second conductive sub-layer 340 and a first buffer sub-layer 350, a part of the connection portion may be the second conductive sub-layer 340 (i.e., the above conductive sub-layer) and the first buffer sub-layer (i.e., the above another first sub-layer).

FIG. 10 is an enlarged view of the electrical pattern layer 300 (e.g., the second connection portion 300*b*) in FIG. 6.

Referring to FIG. 10, a ratio of areas of orthographic projections of any two adjacent first sub-layers in the plurality of first sub-layers on the base substrate 100 is in a range of 0.9 to 1.1, inclusive. In this way, the electrical pattern layer may be formed into a plurality of connection portions by an etching process, thereby reducing process steps. For example, in the two adjacent first sub-layers, an area of an orthographic projection of a lower surface of an upper first sub-layer on the base substrate 100 is smaller than an area of an orthographic projection of a lower surface of a lower first sub-layer on the base substrate 100. In some examples, a ratio of areas of orthographic projections of a lower surface of the first protective sub-layer 310 and a lower surface of the first conductive sub-layer 320 on the base substrate 100 is, for example, 0.9, 0.91, 0.92, 0.93, 0.95, 0.97, 0.99 or 1. Similarly, a ratio of areas of orthographic projections of the lower surface of the first conductive sub-layer 320 and the lower surface of the first protective sub-layer 310 on the base substrate 100 is, for example, 1.01, 1.03, 1.05, 1.07, 1.09 or 1.1.

Referring to FIG. 10, the connection portion includes a bottom surface 300-1 and a side surface 300-2. The bottom surface 300-1 is a surface of the connection portion closest to and parallel to the base substrate 100. The side surface 300-2 is provided adjacent to the bottom surface 300-1. An included angle α between the side surface 300-2 and the bottom surface 300-1 is in a range of 40° to 90°, inclusive. For example, the bottom surface 300-1 of the connection portion is a lower surface shown in FIG. 10, and the side surface 300-2 of the connection portion may be, for example, a left side surface or a right side surface shown in FIG. 10. The included angle α between the bottom surface 300-1 and the side surface 300-2 is, for example, 40°, 45°, 50°, 55°, 60°, 65°, 70°, 75°, 80°, 85° or 90°. For the connection portion formed by a plurality of sub-layers, the materials of different sub-layers will affect the above angle. In the present embodiments, the first conductive sub-layer 320 is made of copper or copper alloy, and the first protective sub-layer 310 is made of nickel or nickel alloy. Based on this, the first conductive sub-layer 320 and the first protective sub-layer 310 may be formed by a single patterning process (e.g., etching together), and may have a good etching angle, thereby forming the connection portion with the above included angle α.

FIG. 11 shows a stacked structure of another wiring board D1 in accordance with embodiments of the present disclosure. What is different from the wiring board D1 shown in FIG. 6 is that the electrical pattern layer 300 in the wiring board D1 shown in FIG. 11 is formed by multiple patterning processes. For other structures, reference may be made to the description of the relevant embodiments in FIG. 6, and details are not described again here.

Referring to FIG. 11, the electrical pattern layer 300 is provided on the fourth insulating layer M4. The plurality of connection portions further include a fourth connection portion 800. The fourth connection portion 800 is coupled to the first power supply voltage terminal VDD.

In some examples, the first conductive sub-layer 320 and the first protective sub-layer 310 are stacked on the fourth insulating layer M4. A portion, with an orthographic projection on the first protective sub-layer 310, of the fourth connection portion 800 in the first protective sub-layer 310 is etched, and the etching is continued to form the first connection portion 300*a*, the second connection portion 300*b* and the fourth connection portion 800. Therefore, the first connection portion 300*a*, the second connection portion 300*b* and the fourth connection portion 800 in the present examples may be formed by multiple processes.

It will be noted that the fourth connection portion 800 shown in FIG. 11 and the third connection portion 300*c* in FIG. 6 have different structures, but have the same function (i.e., both are coupled to the first power supply voltage terminal VDD).

FIG. 12 shows a stacked structure of yet another wiring board D1 in accordance with embodiments of the present disclosure. What is different from the wiring board D1 shown in FIG. 6 is that the first protective sub-layer 310 of the electrical pattern layer 300 in the wiring board D1 shown in FIG. 12 is improved. For other structures, reference may be made to the description of the relevant embodiments in FIG. 6, and details are not described again here.

In some examples, what is different from the first protective sub-layer 310 in FIG. 6 is that the first protective sub-layer 310 shown in FIG. 12 covers an outer surface of the first conductive sub-layer 320 (i.e., an upper surface, a left side surface, and a right side surface of the first conductive sub-layer 320 in FIG. 12). The first protective sub-layer 310 shown in FIG. 12 may be formed by multiple patterning processes, and thus the exposed first conductive sub-layer 320 may be wrapped, thereby preventing the first conductive sub-layer 320 from being oxidized.

It will be noted that in the wiring boards shown in FIGS. 6, 11 and 12, since the connection portions are all exposed, the entire first connection portion or the entire second connection portion may be used as pads p.

FIG. 13 shows a stacked structure of yet another wiring board D1 in accordance with embodiments of the present disclosure. Compared with the wiring board D1 shown in FIG. 6, in the wiring board D1 shown in FIG. 13, a fifth insulating layer M5 is added on a side of the fourth insulating layer M4 away from the base substrate 100. For other structures, reference may be made to the description of the relevant embodiments in FIG. 6, and details are not described again here.

Referring to FIG. 13, the wiring board D1 further includes a fifth insulating layer M5, and the fifth insulating layer M5 is disposed on a side of the fourth insulating layer M4 away from the base substrate 100. The fifth insulating layer M5 includes a second planarization layer PLN2 and a second passivation layer PVX2 that are stacked. For example, the second planarization layer PLN2 is in contact with the first passivation layer PVX1. The material of the second planarization layer PLN2 may be an organic insulating material, and thus the second planarization layer PLN2 may also be called an organic insulating layer. The material of the second passivation layer PVX2 is an inorganic insulating material, and thus the second passivation layer PVX2 may also be called an inorganic insulating layer. The second planarization layer PLN2 covers the electrical pattern layer 300.

In some examples, the second planarization layer PLN2 and the second passivation layer PVX2 are provided with third via holes therein to expose the electrical pattern layer 300. For example, the first connection portion **300*a* and the second connection portion 300*b* are exposed, so that the pins of the electronic component D2 may be soldered to the first connection portion 300*a* and the second connection portion 300*b*** at the third via holes.

In a possible implementation, the first protective sub-layer 310 exposed by the third via hole is parallel to an upper surface of the base substrate 100. That is, the first protective sub-layer 310 shown in FIG. 13 may be a horizontal plane.

In some examples, referring to FIG. 13, portions of connection portions (e.g., the first connection portion **300*a* and the second connection portion 300*b*) exposed by the third via holes may be pads P, and the pins of the electronic component D2 may be soldered to the pads P by the first soldering materials T, so as to realize coupling between the electronic component D2 and the wiring board D1. In the wiring board D1 with third via holes below, the pads P of the wiring board D1 are portions of the connection portions exposed by the third via holes (referring to the related description of the pads P shown in FIG. 13**).

FIG. 14 shows a stacked structure of yet another wiring board D1 in accordance with embodiments of the present disclosure. Compared with the wiring board D1 shown in FIG. 13, the electrical pattern layer 300 in the wiring board D1 shown in FIG. 14 is improved. For other structures, reference may be made to the description of the relevant embodiments in FIG. 13, and details are not described again here.

Referring to FIG. 14, a first conductive sub-layer 320 is formed on the fourth insulating layer M4, a fifth insulating layer M5 is formed on the first conductive sub-layer 320, third via holes are formed in the fifth insulating layer M5 to expose the first conductive sub-layer 320, and a first protective sub-layer 310 is provided in the third via holes. The shape of the first protective sub-layer 310 may be similar to or the same as the shape of the third via. For example, they may both be tapered. Therefore, the process of the electrical pattern layer 300 and the fifth insulating layer M5 in the wiring board D1 shown in FIG. 14 is different from the process of the electrical pattern layer 300 and the fifth insulating layer M5 in the wiring board D1 shown in FIG. 13.

The plurality of connection portions in the wiring board D1 shown in FIG. 14 include a first connection portion **300*a*, a second connection portion 300*b* and a fourth connection portion 800. The fourth connection portion 800 is formed by the first conductive sub-layer 320** and coupled to the first power supply voltage terminal VDD.

FIG. 15 shows a stacked structure of yet another wiring board D1 in accordance with embodiments of the present disclosure. Compared with the wiring board D1 shown in FIG. 13, a second protective sub-layer 330 and a second conductive sub-layer 340 are added in the electrical pattern layer 300 in the wiring board D1 shown in FIG. 15. For other structures, reference may be made to the description of the relevant embodiments in FIG. 13, and details are not described again here. FIG. 16 is an enlarged view of the connection portion (e.g., the second connection portion **300*b*) in FIG. 15. FIG. 17 is a structural diagram of a replacement of FIG. 15. FIG. 18 is an enlarged view of the connection portion (e.g., the second connection portion 300*b*) in FIG. 17**.

Referring to FIGS. 15 to 18, the plurality of first sub-layers further include at least one (e.g., one or more) second protective sub-layer 330 disposed on a side of the first conductive sub-layer 320 proximate to the base substrate 100. For example, the connection portion may include three first sub-layers, that is, the number of the first sub-layers is three. For example, the first protective sub-layer 310, the first conductive sub-layer 320 and the second protective sub-layer 330 are stacked in sequence in a direction pointing to the base substrate 100 (e.g., from top to bottom).

In a case where the first soldering material T may pass through the first protective sub-layer 310 and the first conductive sub-layer 320, for example, in a case where the first protective sub-layer 310 has a small atomic percentage of nickel and/or the first protective sub-layer 310 has a small thickness, the connection portion composed of the first protective sub-layer 310 and the first conductive sub-layer 320 will still be damaged when false soldering occurs or the electronic component D2 is removed. After the electronic component D2 is removed, the electronic component D2 and the connection portion cannot achieve a stable and good connection again. However, by providing at least one second protective sub-layer 330, even if the first protective sub-layer 310 and the first conductive sub-layer 320 are damaged, the second protective sub-layer 330 still exists. Thus, the pins of the electronic component D2 and the second protective sub-layer 330 may also form a stable and good connection again, thereby realizing the coupling between the electronic component D2 and the connection portion, and further improving the repairability rate of the wiring board D1. The second protective sub-layer 330 is configured to hinder diffusion of the first soldering material T.

The plurality of first sub-layers further include at least one (e.g., one or more) second conductive sub-layer 340 disposed on the side of the first conductive sub-layer 320 proximate to the base substrate 100. The second conductive sub-layer(s) 340 and second protective sub-layer(s) 330 are arranged alternately, and a second protective sub-layer 330 is in contact with the first conductive sub-layer 320. For example, referring to FIGS. 15 and 16, the connection portion includes four first sub-layers, that is, the number of the first sub-layers is four. For example, the first protective sub-layer 310, the first conductive sub-layer 320, the second protective sub-layer 330 and the second conductive sub-layer 340 are stacked in sequence in a direction pointing to the base substrate 100 (e.g., from top to bottom).

As another example, referring to FIGS. 17 and 18, the connection portion includes five first sub-layers, that is, the number of the first sub-layers is five. For example, the first protective sub-layer 310, the first conductive sub-layer 320, the second protective sub-layer 330, the second conductive sub-layer 340 and the second protective sub-layer 330 are stacked in sequence in a direction pointing to the base substrate 100 (e.g., from top to bottom). In addition, the connection portion may alternatively include a plurality of (e.g., six, seven or eight) first sub-layers, thus the number of the first sub-layers is not limited here.

In a case where the first soldering material T may pass through the first protective sub-layer 310, the first conductive sub-layer 320 and the second protective sub-layer 330, the connection portion composed of the first protective sub-layer 310, the first conductive sub-layer 320 and the second protective sub-layer 330 will still be damaged when false soldering occurs or the electronic component D2 is removed. After the electronic component D2 is removed, the electronic component D2 and the connection portion cannot achieve a stable and good connection again. However, by providing at least one second conductive sub-layer 340, even if the first protective sub-layer 310, the first conductive sub-layer 320 and the second protective sub-layer 330 are damaged, the second conductive sub-layer 340 still exists. Thus, the pins of the electronic component D2 and the second conductive sub-layer 340 may also form a stable and good connection again, thereby realizing the coupling between the electronic component D2 and the connection portion, and further improving the repairability rate of the wiring board D1.

The material of the second protective sub-layer 330 and the material of the first protective sub-layer 310 include the same composition. For example, the material of the second protective sub-layer 330 and the material of the first protective sub-layer 310 are both pure nickel or nickel alloy. Therefore, for the composition of the material of the second protective sub-layer 330, reference may be made to the related description of the composition of the material of the first protective sub-layer 310, and details are not repeated. In this way, the second protective sub-layer 330 may achieve the same effect as the first protective sub-layer 310, that is, hinder diffusion of the first soldering material T. In some examples, in a case where the material of the second protective sub-layer 330 includes nickel, an atomic percentage of nickel in the material of the second protective sub-layer 330 is less than or equal to an atomic percentage of nickel in the material of the first protective sub-layer 310. In some examples, in a case where the material of the second protective sub-layer 330 includes nickel, the atomic percentage of nickel in the material of the second protective sub-layer 330 may be exactly the same as the atomic percentage of nickel in the material of the first protective sub-layer 310.

FIG. 19 shows a stacked structure of yet another wiring board D1 in accordance with embodiments of the present disclosure. Compared with the wiring board D1 shown in FIG. 17, the wiring board D1 shown in FIG. 19 includes two first connection portions 300*a*. For other structures, reference may be made to the description of the relevant embodiments in FIG. 17, and details are not described again here.

In some examples, the wiring board D1 shown in FIG. 19 includes a second connection portion 300*b* and two first connection portions 300*a*. The two first connection portions 300*a* are respectively coupled to the two transfer portions 710. Two pins of the electronic component are respectively coupled to a first connection portion 300*a* and the second connection portion 300*b*. The other first connection portion 300*a* may also be coupled to the first power supply voltage terminal VDD. In addition, for the number and the structure of the first sub-layers shown in FIG. 19, reference may be made to the related description of the number and the structure of the first sub-layers shown in FIG. 18, and details are not repeated again.

FIG. 20 shows a stacked structure of yet another wiring board D1 in accordance with embodiments of the present disclosure. Compared with the wiring board D1 shown in FIG. 13, a first buffer sub-layer 350 is added to the electrical pattern layer 300 in the wiring board D1 shown in FIG. 20. For other structures, reference may be made to the description of the relevant embodiments in FIG. 13, and details are not described again here. FIG. 21 is an enlarged view of the electrical pattern layer 300 (e.g., the second connection portion 300*b*) in FIG. 20.

Referring to FIGS. 20 and 21, the plurality of first sub-layers further include a first buffer sub-layer 350. The first buffer sub-layer 350 is a sub-layer closest to the base substrate 100 in the plurality of first sub-layers. The material of the first buffer sub-layer 350 contains different components from both the material of the first protective sub-layer 310 and the material of the first conductive sub-layer 320. In some examples, the material of the first protective sub-layer 310 includes pure nickel or nickel alloy, and the material of the first buffer sub-layer 350 includes at least one of molybdenum-niobium alloy, molybdenum-nickel-titanium alloy, molybdenum, molybdenum alloy, titanium and titanium-copper alloy. The first buffer sub-layer 350 also hinders the diffusion of the first soldering material T.

Compared with the wiring board D1 shown in FIG. 17, a first buffer sub-layer 350 is added to the electrical pattern layer 300 in the wiring board D1 shown in FIG. 22. For other structures, reference may be made to the description of the relevant embodiments in FIG. 17, and details are not described again here. FIG. 23 is an enlarged view of the electrical pattern layer 300 (e.g., the second connection portion 300*b*) in FIG. 22.

In some examples, referring to FIGS. 22 and 23, the plurality of first sub-layers include a first protective sub-layer 310, a first conductive sub-layer 320, a second protective sub-layer 330, a second conductive sub-layer 340 and a first buffer sub-layer 350 that are stacked in sequence (e.g., from top to bottom).

In some other examples, the plurality of first sub-layers include a first protective sub-layer 310, a first conductive sub-layer 320, a second protective sub-layer 330 and a first buffer sub-layer 350 that are stacked in sequence (e.g., from top to bottom).

FIG. 24 shows a stacked structure of yet another wiring board D1 in accordance with embodiments of the present disclosure.

In some examples, the wiring board D1 shown in FIG. 24 includes a second connection portion 300*b* and two first connection portions 300*a*. The two first connection portions 300*a* are respectively coupled to the first electrode region 420 and the second electrode region 430. Two pins of the electronic component are respectively coupled to a first connection portion 300*a* and the second connection portion 300*b*. The other first connection portion 300*a* may also be coupled to the first power supply voltage terminal VDD. In addition, for the number and the structure of the first sub-layers shown in FIG. 24, reference may be made to the related description of the number and the structure of the first sub-layers shown in FIG. 22. For other structures, reference may be made to the description of the relevant embodiments in FIG. 22, and details are not described again here.

FIG. 25 shows a stacked structure of yet another wiring board D1 in accordance with embodiments of the present disclosure.

Referring to FIG. 25, the transfer portion 710 includes at least one of a first protection sub-layer 711 and a second protection sub-layer 713, and a transfer sub-layer 712. The first protection sub-layer 711 is stacked on a side of the transfer sub-layer 712 away from the base substrate 100, and the material of the first protection sub-layer 711 includes nickel. The second protection sub-layer 713 is stacked on a side of the transfer sub-layer 712 proximate to the base substrate 100, and the material of the second protection sub-layer 713 includes nickel. The material of the first protection sub-layer 711 and the material of the second protection sub-layer 713 may both be the same as the material of the first protective sub-layer 310, that is, the material of the first protection sub-layer 711 includes nickel, the material of the second protection sub-layer 713 includes nickel, and reference may be made to the related description that the material of the first protective sub-layer 310 includes nickel. The material of the transfer sub-layer 712 is the same as the material of the transfer portion 710 disclosed in the above embodiments.

For example, the transfer portion 710 includes a first protection sub-layer 711 and a transfer sub-layer 712. The first protection sub-layer 711 is stacked on a side of the transfer sub-layer 712 away from the base substrate 100, and the material of the first protection sub-layer 711 includes nickel.

The first protection sub-layer 711 may prevent the transfer sub-layer 712 from being oxidized. When the transfer portion 710 and the connection portion are soldered, the first protection sub-layer 711 and the soldering material form an intermetallic compound, and the first protection sub-layer 711 may further hinder diffusion of the soldering material. If the connection portion on a side of the transfer portion 710 away from the base substrate 100 is removed, the first protection sub-layer 711 may be damaged. However, since the transfer portion 710 further includes the transfer sub-layer 712, and thus the electronic component may further be fixedly connected to the transfer sub-layer 712 of the transfer portion 710 again.

For example, the transfer portion 710 includes a second protection sub-layer 713 and a transfer sub-layer 712. The second protection sub-layer 713 is stacked on a side of the transfer sub-layer proximate to the base substrate 100, and the material of the second protection sub-layer 713 includes nickel.

If the connection portion on a side of the transfer portion 710 away from the base substrate 100 is removed, the transfer sub-layer 712 may be damaged. However, the transfer portion 710 still has the second protection sub-layer 713, and thus the electronic components may further be fixedly connected to the second protection sub-layer 713 of the transfer portion 710 again. The second protection sub-layer 713 may hinder diffusion of the soldering material.

For example, the transfer portion 710 includes a first protection sub-layer 711, a second protection sub-layer 713 and a transfer sub-layer 712. The first protection sub-layer 711 is stacked on a side of the transfer sub-layer 712 away from the base substrate 100, and the material of the first protection sub-layer 711 includes nickel. The second protection sub-layer 713 is stacked on a side of the transfer sub-layer 712 proximate to the base substrate 100, and the material of the second protection sub-layer 713 includes nickel.

The first protection sub-layer 711 may prevent the transfer sub-layer 712 from being oxidized. When the transfer portion 710 and the connection portion are soldered, the first protection sub-layer 711 and the soldering material form an intermetallic compound, and the first protection sub-layer 711 may further hinder diffusion of the soldering material. In some examples, after the connection portion is removed from the transfer portion 710, the first protection sub-layer 711 may be damaged. However, the transfer portion 710 still has the transfer sub-layer 712 and the second protection sub-layer 713, and thus the electronic component may further be fixedly connected to the transfer sub-layer 712 of the transfer portion 710 again.

In some other examples, if the connection portion on a side of the transfer portion 710 away from the base substrate 100 is removed, the first protection sub-layer 711 and the transfer sub-layer 712 may be damaged. However, the transfer portion 710 still has the second protection sub-layer 713, and thus the electronic component may further be fixedly connected to the second protection sub-layer 713 of the transfer portion 710 again. The second protection sub-layer 713 may hinder diffusion of the soldering material.

With continued reference to FIG. 25, the gate 210 in the wiring board D1 includes at least one of a third protection sub-layer 211 and a fourth protection sub-layer 213, and a gate conductive sub-layer 212. The third protection sub-layer 211 is stacked on a side of the gate conductive sub-layer 212 away from the base substrate 100, and the material of the third protection sub-layer 211 includes nickel. The fourth protection sub-layer 213 is stacked on a side of the gate conductive sub-layer 212 proximate to the base substrate 100, and the material of the fourth protection sub-layer 213 includes nickel. The material of the third protection sub-layer 211 and the material of the fourth protection sub-layer 213 are both the same as the material of the first protective sub-layer 310, that is, the material of the third protection sub-layer 211 includes nickel, the material of the fourth protection sub-layer 213 includes nickel, and reference may be made to the related description that the material of the first protective sub-layer 310 includes nickel, and details are not repeated. The material of the gate conductive sub-layer 212 may refer to the relevant description of the material of the gate 210 in the above disclosed embodiments.

For example, the gate 210 includes a third protection sub-layer 211 and a gate conductive sub-layer 212. The third protection sub-layer 211 is stacked on a side of the gate conductive sub-layer 212 away from the base substrate 100, and the material of the third protection sub-layer 211 includes nickel.

As another example, the gate 210 includes a fourth protection sub-layer 213 and a gate conductive sub-layer 212. The fourth protection sub-layer 213 is stacked on a side of the gate conductive sub-layer 212 proximate to the base substrate 100, and the material of the fourth protection sub-layer 213 includes nickel.

As another example, the gate 210 includes a third protection sub-layer 211, a fourth protection sub-layer 213 and a gate conductive sub-layer 212. The third protection sub-layer 211 is stacked on a side of the gate conductive sub-layer 212 away from the base substrate 100, and the material of the third protection sub-layer 211 includes nickel. The fourth protection sub-layer 213 is stacked on a side of the gate conductive sub-layer 212 proximate to the base substrate 100, and the material of the fourth protection sub-layer 213 includes nickel.

FIG. 26 shows a stacked structure of yet another wiring board D1 in accordance with embodiments of the present disclosure. The material of the active pattern layer 400 may be an oxide semiconductor. For example, the oxide semiconductor may be IGZO, IGTO, IZO, or CAAC. Then, the transistors are oxide transistors.

Referring to FIG. 26, two transfer portions 710 are respectively coupled to the first electrode region 420 and the second electrode region 430, and the transfer portions 710 are in direct contact with or directly overlapped with the first electrode region 420 and the second electrode region 430. In this way, the thickness of the wiring board in the X direction may be reduced.

In some examples, the gate pattern layer 200 may be disposed on the base substrate 100. The first insulating layer M1 is disposed on the base substrate 100, and the first insulating layer M1 covers the gate pattern layer 200. The active pattern layer 400 is disposed on a side of the first insulating layer M1 away from the base substrate 100. The fourth insulating layer M4 is disposed on the first insulating layer M1. For example, the first passivation layer PVX1 is disposed on the first insulating layer M1, so that the first planarization layer PLN1 covers the active pattern layer 400 and the transfer pattern layer 700, that is, the active pattern layer 400 and the transfer pattern layer 700 are provided on the same layer. The electrical pattern layer 300 is disposed on the first passivation layer PVX1. The second passivation layer PVX2 is disposed on the first passivation layer PVX1 and covers the electrical pattern layer 300. The first passivation layer PVX1 is provided with a second via hole therein to expose the transfer portion 710. In this case, the oxide transistor has a bottom-gate structure.

An orthographic projection of the gate 210 on the base substrate 100 covers an orthographic projection of a channel region (i.e., of the active pattern 410) on the base substrate 100. The electrical pattern layer 300 further includes a light-shielding portion 300*d* (shown in FIG. 26), and an orthographic projection of the light-shielding portion on the base substrate 100 covers the orthographic projection of the channel region (i.e., of the active pattern 410) on the base substrate 100. In this way, for the transistors (e.g., oxide transistors), the light-shielding portion may cover a surface of the active pattern 410 away from the base substrate 100, thereby avoiding light being irradiated on the surface of the active pattern 410 away from the base substrate (i.e., avoiding light being irradiated on a top surface of the active pattern 410). The gate 210 (i.e., a bottom gate structure) is provided on a side of the active pattern 410 proximate to the base substrate 100. The gate 210 may be used to avoid light being irradiated on a surface of the active pattern 410 proximate to the base substrate (i.e., avoiding light being irradiated on a bottom surface of the active pattern 410). The light-shielding portion includes a plurality of second sub-layers that are stacked. In a direction perpendicular to the base substrate 100, the second sub-layer and the first sub-layer with the same stacking order are provided to have the same material.

In some examples, the connection portions include a first connection portion 300*a*, a second connection portion 300*b*, and a third connection portion 300*c*. The third connection portion 300*c* may be the above light-shielding portion, that is, the plurality of first sub-layers included in the third connection portion 300*c* and the plurality of second sub-layers included in the light-shielding portion are arranged in the same stacking order, and in a direction perpendicular to the base substrate 100, the second sub-layer and the first sub-layer with the same stacking order are also provided to have the same material.

FIG. 27 shows a stacked structure of yet another wiring board D1 in accordance with embodiments of the present disclosure. The wiring board D1 of oxide transistor(s) and polysilicon transistor(s) may be formed by multiple processes.

Referring to FIG. 27, compared to FIG. 13, the wiring board D1 shown in FIG. 27 includes a polysilicon transistor and an oxide transistor. The oxide transistor includes a gate, an active pattern, a first electrode region, a second electrode region, a transfer portion and insulating layers (e.g., a ninth insulating layer and a tenth insulating layer).

In some examples, the ninth insulating layer M9 and the tenth insulating layer M10 are disposed between the fourth insulating layer M4 and the second insulating layer M2. The active pattern 410*a* of the oxide transistor is disposed on the second insulating layer M2. The ninth insulating layer M9 covers the second insulating layer M2. The gate 210*a* is disposed on the ninth insulating layer M9. The tenth insulating layer M10 covers the ninth insulating layer M9. The transfer portion 710*a* penetrates the ninth insulating layer M9 and the tenth insulating layer M10 to be coupled to the first electrode region and the second electrode region of the oxide transistor. The fourth insulating layer M4 covers the tenth insulating layer M10.

In this way, in the wiring board D1 shown in FIG. 27, both the polysilicon transistor and the oxide transistor may be formed, thereby reducing process steps.

FIG. 28*a* shows a functional backplane provided by embodiments of the present disclosure. FIG. 28*b* is an enlarged view of a region J in FIG. 28*a*.

Referring to FIGS. 28*a* and 28*b*, the embodiments of the present disclosure further provide a functional backplane. The functional backplane 10 may include the above wiring board D1 and an electronic component D2. The connection portions of the electrical pattern layer 300 located in the device region SA are coupled to the electronic component D2 by the first soldering material T. For example, the first connection portion 300*a* and the second connection portion 300*b* of the electrical pattern layer 300 located in the device region SA are respectively soldered to the first pin D21 and the second pin D22 of the electronic component D2. In some examples, the pins of the electronic component D2 may be coupled to the connection portions by way of die-bonding.

A portion, proximate to the first soldering material T, of the first protective sub-layer 310 of the connection portion located in the device region SA and the first soldering material T form a first intermetallic compound K1. For example, a portion, proximate to the first soldering material T, of the first protective sub-layer 310 of the first connection portion 300*a* and the first soldering material T form the first intermetallic compound K1.

The circuit board D3 and the connection portions located in the bonding region SS are coupled by the second soldering material. A portion, proximate to the second soldering material, of the first protective sub-layer 310 of the connection portion located in the bonding region SS and the second soldering material form a second intermetallic compound.

The electrical pattern layer 300 further includes connection portions (denoted as fifth connection portions) located in the bonding region SS. The fifth connection portions are coupled to the circuit board D3 by the second soldering material. A portion, proximate to the second soldering material, of the first protective sub-layer 310 of the fifth connection portion and the second soldering material form the second intermetallic compound.

Based on the wiring board shown in FIG. 13 and the functional backplane shown in FIGS. 28*a* and 28*b*, FIG. 29 shows another functional backplane provided by embodiments of the present disclosure. Referring to FIG. 29, in some examples, the electronic component D2 may be soldered on the connection portions through the second planarization layer PLN2 and the second passivation layer PVX2. The electronic component D2 may be soldered on the connection portions through the third via holes.

FIG. 30 shows another functional backplane provided by embodiments of the present disclosure. The functional backplane may refer to the wiring board shown in FIG. 14 and the functional backplane shown in FIGS. 28*a* and 28*b*, and details are not repeated.

Some embodiments of the present disclosure provide a method for manufacturing the wiring board. Referring to FIG. 31, the method S1000 for manufacturing the wiring board includes steps S100 to S600, as detailed below.

Figure 32:
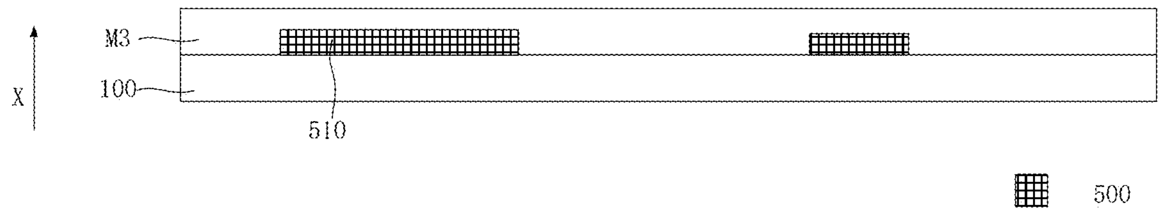

In step S100, referring to FIG. 32, a light-shielding pattern layer 500 is formed on the base substrate 100, and then a third insulating layer M3 is formed on the base substrate 100. The light-shielding pattern layer 500 includes a plurality of light-shielding blocks. The third insulating layer M3 covers the base substrate 100 and the light-shielding pattern layer 500.

In some examples, the light-shielding pattern layer 500 is deposited by sputtering. The material of the light-shielding pattern layer 500 is metal, and the metal may be a metal element such as Mo, Ti or Cu, or a metal alloy such as Mo TiNi (MTD) or MoNb. The thickness of the light-shielding pattern layer 500 is in a range of 300 Å to 1000 Å, inclusive.

Figure 33:
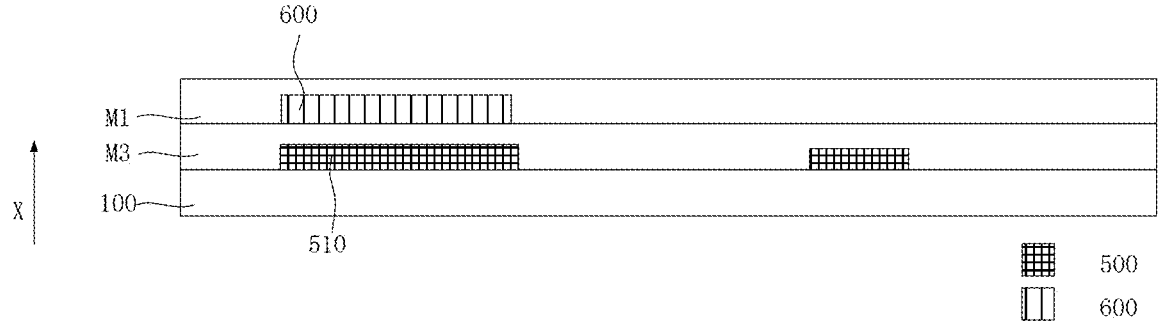

In step S200, referring to FIG. 33, a semiconductor pattern layer 600 (e.g., polysilicon) is formed on the third insulating layer M3, and then a first insulating layer M1 is formed. The first insulating layer M1 covers the semiconductor pattern layer 600 and the third insulating layer M3.

In some examples, a semiconductor pattern layer (e.g., amorphous silicon (a-Si)) is formed by vapor deposition, and has a thickness in a range of 300 Å to 1000 Å, inclusive. The a-Si is modified into p-Si (e.g., using an excimer laser annealing (ELA) technology) to form the semiconductor pattern layer 600.

Figure 34:
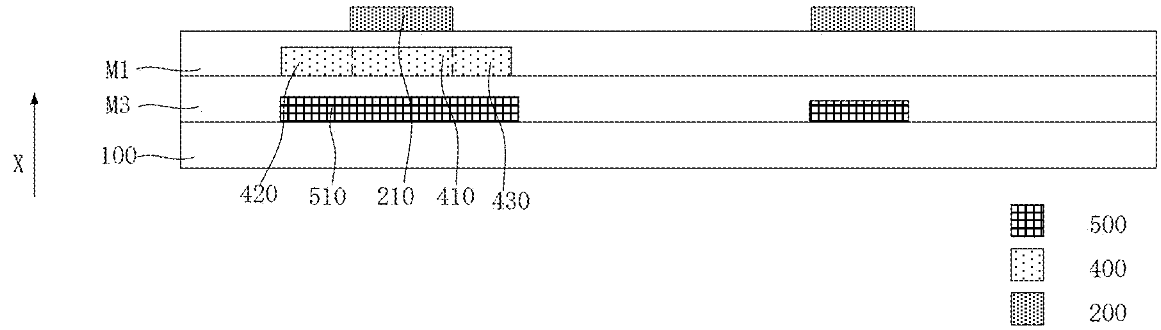

In step S300, referring to FIG. 34, a gate pattern layer 200 is formed on the first insulating layer M1, and then a second insulating layer M2 is formed. The gate pattern layer 200 includes a plurality of gates 210. The semiconductor pattern layer 600 is doped to form an active pattern layer 400. The active pattern layer 400 includes an active pattern 410, a first electrode region 420 and a second electrode region 430. The second insulating layer M2 covers the gate pattern layer 200 and the first insulating layer M1.

In some examples, the gate pattern layer 200 is formed by vapor deposition, and the material of the gate pattern layer 200 may be at least one of SiN and SiO. A thickness of the gate pattern layer 200 is in a range of 1000 Å to 4000 Å, inclusive.

Figure 35:
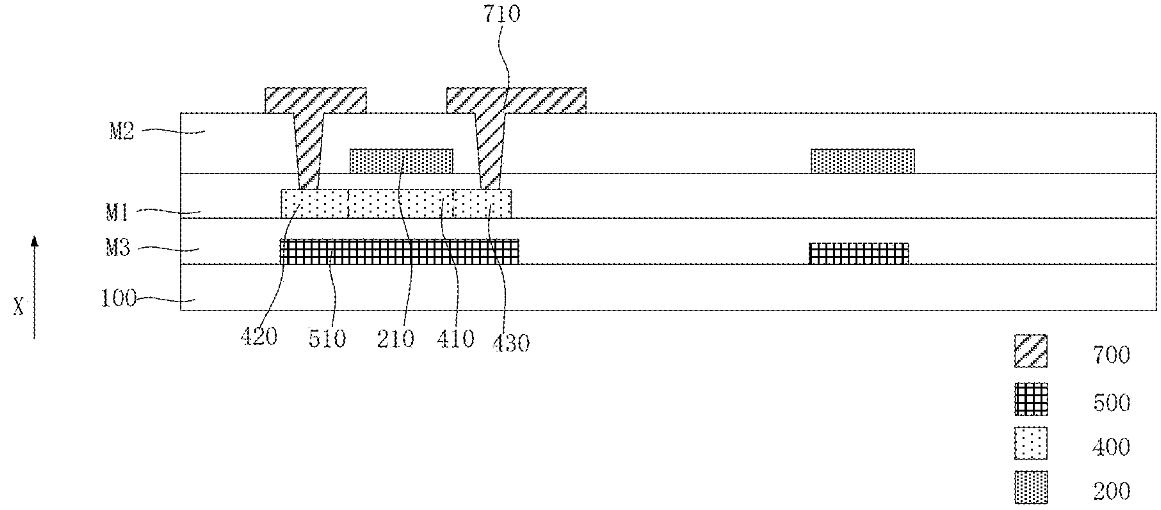

In step S400, referring to FIG. 35, a transfer pattern layer 700 is formed on the second insulating layer M2. The transfer pattern layer 700 includes a plurality of transfer portions 710, and two transfer portions 710 are respectively coupled to the first electrode region 420 and the second electrode region 430. The first insulating layer and the second insulating layer are provided with a plurality of first via holes therein. While the transfer pattern layer is formed, conductive portions are also formed by deposition in the first via holes. That is, the transfer portions 710 are coupled to the first electrode region 420 and the second electrode region 430 by the conductive portions.

Figure 36:
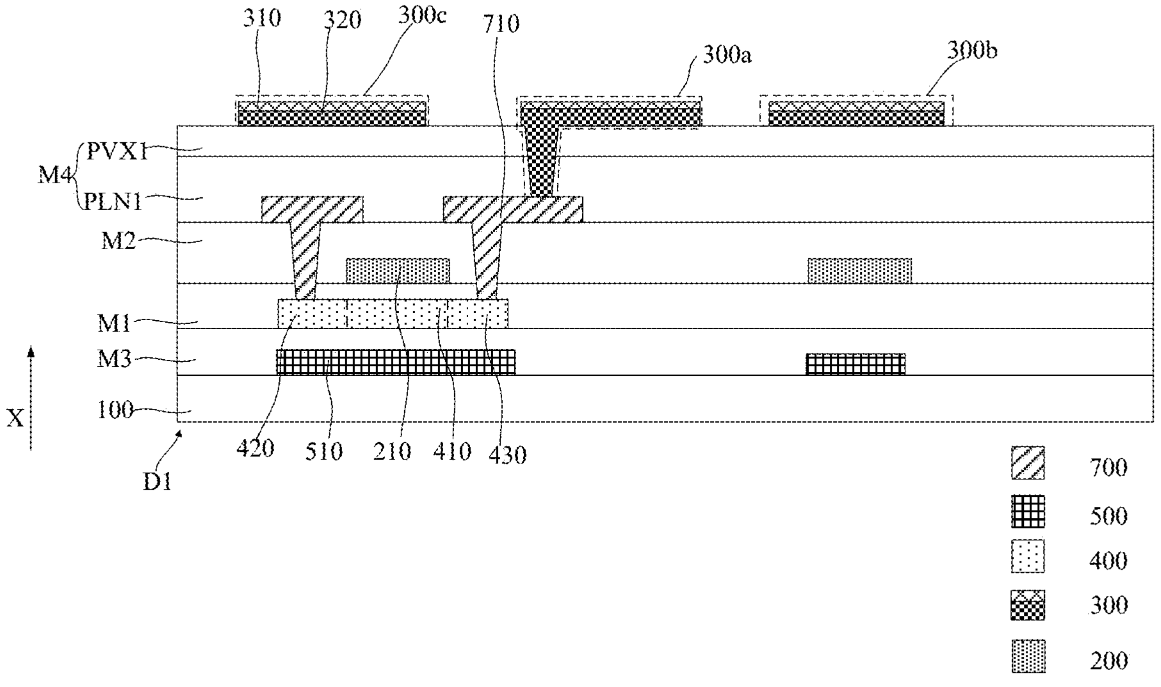

In step S500, referring to FIG. 36, an electrical pattern layer 300 is formed on a side of the active pattern layer 400 away from the base substrate 100. The electrical pattern layer 300 includes a plurality of connection portions, and at least one connection portion is coupled to the active pattern 410.

In some examples, a fourth insulating layer M4 is formed on the second insulating layer M2, and the fourth insulating layer M4 includes a first planarization layer PLN1 and a first passivation layer PVX1. The first planarization layer PLN1 covers the transfer pattern layer 700, and the first passivation layer PVX1 is formed on the first planarization layer PLN1. The first passivation layer PVX1 and the first planarization layer PLN1 are provided with a plurality of second via holes therein to expose transfer portions 710 coupled to the first electrode region 420 and the second electrode region 430.

In some examples, the electrical pattern layer 300 is formed on the first passivation layer PVX1. The connection portion is coupled to the active pattern 410 through the second via hole.

The connection portion includes a plurality of first sub-layers that are stacked. Two first sub-layers farthest away from the base substrate 100 in the plurality of first sub-layers are a first conductive sub-layer 320 and a first protective sub-layer 310. The first protective sub-layer 310 is provided on a side of the first conductive sub-layer 320 away from the base substrate 100, and the material of the first protective sub-layer 310 includes nickel.

It will be noted that, for the connection portion in step S500, reference may be made to the related description of the number of layers of the connection portion and the material of each layer in the disclosed examples of the wiring board D1, and details are not repeated.

The method of forming the first sub-layer is as following: forming the first conductive sub-layer 320, and forming the first protective sub-layer 310 on the first conductive sub-layer 320.

In some examples, at least one second protective sub-layer 330 is provided. The first conductive sub-layer 320 is formed on a second protective sub-layer 330, and the first protective sub-layer 310 is formed on the first conductive sub-layer 320. The material of the second protective sub-layer 330 may be MoNb, MTD, Mo, Mo alloy, Ti, TiCu, or the like. A thickness of the second protective sub-layer 330 is in a range of 200 Å to 1000 Å, inclusive. The material of the first conductive sub-layer 320 is a metal with a good conductive property such as Cu. A thickness of the first conductive sub-layer 320 may be selected from a range of 0.3 μm to 2 μm, inclusive.

In some other examples, at least one second conductive sub-layer 340 and at least one second protective sub-layer 330 are formed alternately. The first conductive sub-layer 320 is formed on a second protective sub-layer 330, and the first protective sub-layer 310 is formed on the first conductive sub-layer 320.

In some other examples, a first buffer sub-layer 350 is formed. The first conductive sub-layer 320 is formed on the first buffer sub-layer 350, and the first protective sub-layer 310 is formed on the first conductive sub-layer 320.

In a possible implementation, a first buffer sub-layer 350 is formed. At least one second conductive sub-layer 340 and at least one second protective sub-layer 330 are formed alternately on the first buffer sub-layer 350. The first conductive sub-layer 320 is formed on a second protective sub-layer 330, and the first protective sub-layer 310 is formed on the first conductive sub-layer 320.

For the materials of the first protective sub-layer 310, the first conductive sub-layer 320, the second protective sub-layer 330, the second conductive sub-layer 340 and the first buffer sub-layer 350, reference may be made to the relevant descriptions above.

Figure 37:
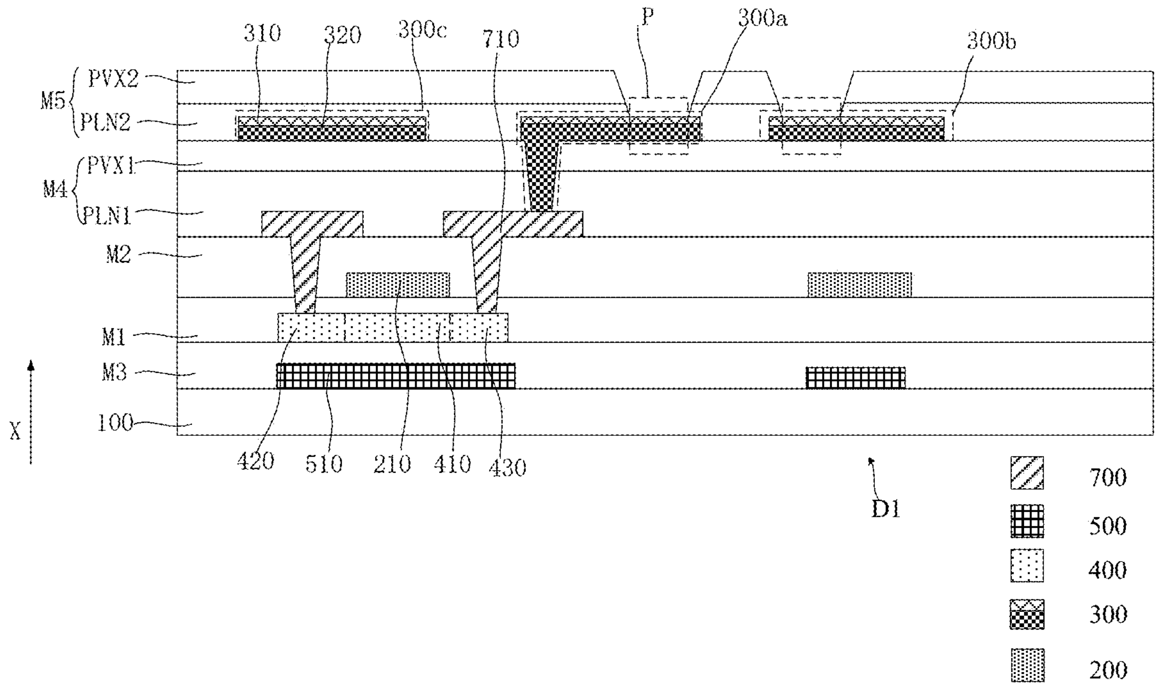

In step S600, referring to FIG. 37, for example, a second planarization layer PLN2 is deposited on the first passivation layer PVX1, and a second passivation layer PVX2 is formed on the second planarization layer PLN2. The second passivation layer PVX2 and the second planarization layer PLN2 are provided with a plurality of third via holes therein.

As another example, a second passivation layer PVX2 is deposited on the first passivation layer PVX1, and a second planarization layer PLN2 is formed on the second passivation layer PVX2.

In some examples, the second passivation layer PVX2 is formed by vapor deposition. The material of the second passivation layer PVX2 may be at least one of SiN and SiO. A thickness of the second passivation layer PVX2 is in a range of 1000 Å to 3000 Å, inclusive. Then, the second planarization layer PLN2 is formed by a photolithography process, and a thickness of the second planarization layer PLN2 is in a range of 2 μm to 5 μm, inclusive.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A wiring board, comprising:
a base substrate;
an active pattern layer disposed on a side of the base substrate and including a plurality of active patterns; and
an electrical pattern layer disposed on a side of the active pattern layer away from the base substrate and including a plurality of connection portions, at least one connection portion being coupled to an active pattern, wherein
a connection portion includes a plurality of first sub-layers that are stacked in a thickness direction of the base substrate, two first sub-layers farthest away from the base substrate in the plurality of first sub-layers are a first conductive sub-layer and a first protective sub-layer;
the first protective sub-layer is disposed on a side of the first conductive sub-layer away from the base substrate, and a material of the first protective sub-layer includes nickel.

2. The wiring board according to claim 1, wherein
the material of the first protective sub-layer is pure nickel; or the material of the first protective sub-layer is nickel alloy with an atomic percentage of nickel greater than or equal to 40%; or
the material of the first protective sub-layer further includes at least one of tungsten, vanadium, palladium, aluminum, titanium, zirconium molybdenum, copper, yttrium, niobium, platinum, tin, tantalum, gold and silver; or
the material of the first protective sub-layer is nickel alloy with an atomic percentage of nickel greater than or equal to 40%, and the material of the first protective sub-layer further includes at least one of tungsten, vanadium, palladium, aluminum, titanium, zirconium, molybdenum, copper, yttrium, platinum, tin, tantalum, gold and silver.

3. The wiring board according to claim 1, wherein
a thickness of the first protective sub-layer is in a range of 80 Å to 5000 Å, inclusive; and/or
a ratio of areas of orthographic projections of any two first sub-layers in the plurality of first sub-layers on the base substrate is in a range of 0.9 to 1.1, inclusive.

4. The wiring board according to claim 1, wherein
the plurality of first sub-layers further include at least one second protective sub-layer disposed on a side of the first conductive sub-layer proximate to the base substrate, and a material of the second protective sub-layer includes nickel.

5. The wiring board according to claim 4, wherein
the plurality of first sub-layers further include at least one second conductive sub-layer disposed on the side of the first conductive sub-layer proximate to the base substrate; the second conductive sub-layer and the second protective sub-layer are disposed alternately, and a second protective sub-layer is in contact with the first conductive sub-layer.

6. The wiring board according to claim 5, wherein
the material of the second protective sub-layer and the material of the first protective sub-layer include a same composition.

7. The wiring board according to claim 4, wherein
an atomic percentage of nickel in the material of the second protective sub-layer is less than or equal to an atomic percentage of nickel in the material of the first protective sub-layer.

8. The wiring board according to claim 1, wherein
the plurality of first sub-layers further include a first buffer sub-layer, the first buffer sub-layer is a first sub-layer closest to the base substrate in the plurality of first sub-layers; and a material of the first buffer sub-layer contains different components from both the material of the first protective sub-layer and a material of the first conductive sub-layer; or
the plurality of first sub-layers further include a first buffer sub-layer, the first buffer sub-layer is a first sob-layer closest to the base substrate in the plurality of first sub-layers; a material of the first buffer sub-layer contains different components from both the material of the first protective sub-laver and a material of the first conductive sub-layer, and the material of the first buffer sub-layer includes at least one of molybdenum-niobium alloy, molybdenum-nickel-titanium alloy, molybdenum, molybdenum alloy, titanium and titanium-copper alloy.

9. The wiring board according to claim 1, wherein the connection portion includes a bottom surface and a side surface; the bottom surface is a surface of the connection portion closest to and parallel to the base substrate; the side surface is adjacent to the bottom surface; and an included angle between the side surface and the bottom surface is in a range of 40° to 90°, inclusive.

10. The wiring board according to any claim 1, further comprising:

a transfer portion disposed between the electrical pattern layer and the active pattern layer, wherein the transfer portion is coupled to the active pattern and a connection portion in the at least one connection portion.

11. The wiring board according to claim 10, wherein the transfer portion includes at least one of a first protection sub-layer and a second protection sub-layer, and a transfer sub-layer; the first protection sub-layer is stacked on a side of the transfer sub-layer away from the base substrate, and a material of the first protection sub-layer includes nickel; the second protection sub-layer is stacked on a side of the transfer sub-layer proximal to the base substrate, and a material of the second protection sub-layer includes nickel.

12. The wiring board according to claim 1, further comprising:

a gate pattern layer disposed on the base substrate and including a plurality of gates; a gate includes at least one of a third protection sub-layer and a fourth protection sub-layer, and a gate conductive sub-layer; the third protection sub-layer is stacked on a side of the gate conductive sub-layer away from the base substrate, and a material of the third protection sub-layer includes nickel; the fourth protection sub-layer is stacked on a side of the gate conductive sub-layer proximate to the base substrate, and a material of the fourth protection sub-layer includes nickel.

13. The wiring board according to claim 1, further comprising:

a gate pattern layer disposed between the active pattern layer and the base substrate and including a plurality of gates, wherein an orthographic projection of a gate on the base substrate covers an orthographic projection of the active pattern on the base substrate; and the electrical pattern layer further includes a light-shielding portion, an orthographic projection of the light-shielding portion on the base substrate covers the orthographic projection of the active pattern on the base substrate; the light-shielding portion includes a plurality of second sub-layers that are stacked; and in the direction perpendicular to the base substrate, a second sub-layer and a first sub-layer with a same stacking order have a same material.

14. A functional backplane, comprising:

the wiring board according to claim 1, the wiring board having a device region and a bonding region;

an electronic component disposed on a side of the electrical pattern layer away from the base substrate, and a first intermetallic compound, who a portion of a connection portion in the electrical pattern layer located in the device region is coupled to the electronic component by the first intermetallic compound.

15. The functional backplane according to claim 14, further comprising:

a circuit board coupled to the wiring board; and a second in intermetallic compound, wherein a portion of a connection portion located in the bonding region is coupled to the circuit board by the second intermetallic compound.

16. A backlight module, comprising the functional backplane according to claim 14, wherein the electronic component is a light-emitting device.

17. A display apparatus, comprising:

the backlight module according to claim 16.

18. A display module, comprising the functional backplane according to claim 14, wherein the electronic component is a light-emitting device.

19. A display apparatus, comprising the display module according to claim 18.

20. A method for manufacturing a wiring board, comprising:

forming an active pattern layer on a base substrate, the active pattern layer including a plurality of active patterns; and forming an electrical pattern layer on the base substrate on which the active pattern layer has been formed, the electrical pattern layer including a plurality of connection portions, and at least one connection portion being coupled to an active pattern; wherein a connection portion includes a plurality of first sub-layers that are stacked, two first sub-layers farthest away from the base substrate in the plurality of first sub-layers are a first conductive sub-layer and a first protective sub-layer; the first protective sub-layer is disposed on a side of the first conductive sub-layer away from the base substrate, and a material of the first protective sub-layer includes nickel.

* * * * *